(12) United States Patent
Uematsu et al.

(10) Patent No.: US 9,386,697 B2
(45) Date of Patent: *Jul. 5, 2016

(54) WIRING BOARD, ELECTRONIC COMPONENT EMBEDDED SUBSTRATE, METHOD OF MANUFACTURING WIRING BOARD, AND METHOD OF MANUFACTURING ELECTRONIC COMPONENT EMBEDDED SUBSTRATE

(71) Applicant: TDK Corporation, Tokyo (JP)

(72) Inventors: Hiroyuki Uematsu, Tokyo (JP); Kenichi Kawabata, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/302,946

(22) Filed: Jun. 12, 2014

(65) Prior Publication Data

US 2014/0293561 A1    Oct. 2, 2014

Related U.S. Application Data

(62) Division of application No. 13/310,959, filed on Dec. 5, 2011, now Pat. No. 8,822,837.

(30) Foreign Application Priority Data

Dec. 7, 2010 (JP) ................... 2010-272912

(51) Int. Cl.
     *H05K 1/11*      (2006.01)
     *H05K 1/18*      (2006.01)
     (Continued)

(52) U.S. Cl.
     CPC ............. *H05K 1/115* (2013.01); *H05K 1/185* (2013.01); *H05K 3/427* (2013.01); *H05K 1/188* (2013.01);
(Continued)

(58) Field of Classification Search
CPC ....... H05K 1/115; H05K 1/185; H05K 3/427; H05K 1/188; H05K 3/0035; H05K 3/0038; H05K 2201/0187; H05K 2201/09563; H05K 2203/095; Y10T 29/49147; Y10T 29/49165; Y10T 29/49146; Y10T 29/4913
USPC .......... 174/250–268; 361/760–761, 792–795, 361/803
See application file for complete search history.

(56) References Cited

U.S. PATENT DOCUMENTS 6,038,133 A    3/2000   Nakatani et al.
7,091,593 B2 *   8/2006   Ishimaru ............. H01L 23/5389
                                                       257/686

(Continued)

FOREIGN PATENT DOCUMENTS

JP      H-05-7080      1/1993
JP      A-06-260766      9/1994

(Continued)

*Primary Examiner* — Ishwarbhai B Patel
(74) *Attorney, Agent, or Firm* — Oliff PLC

(57) ABSTRACT

A wiring board or an electronic component embedded substrate includes a substrate that includes a resin containing a plurality of fillers; and a via that is electrically connected to at least one interconnect provided to the substrate, wherein the via includes a mix area in which metal is provided between the fillers on an inner radial side with respect to the substrate. A method of manufacturing a wiring board or an electronic component embedded substrate includes preparing a substrate that includes a resin containing a plurality of fillers; forming a via formation hole in the substrate; performing an ashing process on at least an inner wall of the via formation hole; and performing electroless plating on the inner wall of the via formation hole.

2 Claims, 17 Drawing Sheets

(51) Int. Cl.
    *H05K 3/42*    (2006.01)
    *H05K 3/00*    (2006.01)
(52) U.S. Cl.
    CPC ............ *H05K 3/0035* (2013.01); *H05K 3/0038* (2013.01); *H05K 2201/0187* (2013.01); *H05K 2201/09563* (2013.01); *H05K 2203/095* (2013.01); *Y10T 29/4913* (2015.01); *Y10T 29/49146* (2015.01); *Y10T 29/49147* (2015.01); *Y10T 29/49165* (2015.01)

(56) References Cited

U.S. PATENT DOCUMENTS

| 7,285,728 | B2 | 10/2007 | Sunohara et al. |
| 8,116,066 | B2 | 2/2012 | Inoue |
| 8,129,623 | B2 | 3/2012 | Nagasawa et al. |
| 8,822,837 | B2* | 9/2014 | Uematsu ................ H05K 3/427 174/260 |
| 2011/0051386 | A1* | 3/2011 | Nagasawa ............. H01L 21/486 361/783 |

FOREIGN PATENT DOCUMENTS

| JP | A-10-337699 | 12/1998 |
| JP | A-11-214850 | 8/1999 |
| JP | A-2005-236150 | 9/2005 |
| JP | A-2009-200389 | 9/2009 |

* cited by examiner

PLASMA CONDITION 100 nm
MAGNIFICATION × 25000

PLASMA CONDITION 250 nm
MAGNIFICATION × 25000

PLASMA CONDITION 100 nm
MAGNIFICATION × 5000

PLASMA CONDITION 100 nm
MAGNIFICATION × 25000

AFTER PLATING
PLASMA CONDITION 100 nm
MAGNIFICATION × 25000

RELATION BETWEEN PLASMA CONDITION AND PEEL RESISTANCE

US 9,386,697 B2

WIRING BOARD, ELECTRONIC COMPONENT EMBEDDED SUBSTRATE, METHOD OF MANUFACTURING WIRING BOARD, AND METHOD OF MANUFACTURING ELECTRONIC COMPONENT EMBEDDED SUBSTRATE

CROSS-REFERENCE TO RELATED APPLICATIONS

This is a Divisional Application of application Ser. No. 13/310,959 filed Dec. 5, 2011 which is a National Phase of PCT/EP2007/009901 filed Nov. 19, 2007 which is based upon and claims the benefit of priority from Japanese Patent Application No. 2010-272912, filed on Dec. 7, 2010, the entire contents of which are incorporated herein by reference.

BACKGROUND OF THE INVENTION

1. Field of the Invention

The present invention relates to a wiring board that includes an interlayer connection layer in an insulating substrate, an electronic component embedded substrate, a method of manufacturing a wiring board, and a method of manufacturing an electronic component embedded substrate.

2. Description of the Related Art

Many recent circuit boards are highly dense. Wiring boards that include an interlayer connection layer in an insulating substrate have been proposed as boards on which interconnects can be provided densely.

For example, Japanese Laid-open Patent Publication No. 11-214850 discloses a method of manufacturing a printed board that includes a step of forming an interconnect pattern on the surface of a core material; a step of forming, on the surface of the core material that includes the interconnect pattern, an insulating layer made of organic resin in which an inorganic filler is mixed; a step of selectively forming, in the insulating layer, a connection hole that reaches the interconnect pattern; a step of performing surface roughening by removing the surface of the insulating layer by dry etching; a step of forming, by using vacuum film forming, an electroplating conductive film on the surface of the insulating layer that contains the inorganic filler; and a step of forming a conductive film on the electroplating conductive film by electroplating. The document describes that a printed board having a fine interconnect width and interconnect interval can be formed, with a smaller number of steps.

To cope with the fine interconnect, the via diameter decreases and the aspect ratio (via depth/via diameter) increases. As the aspect ratio increases, it becomes difficult to provide a conductive film stably on the surface of the insulating layer near the bottom of a via formation hole for forming a via. If the conductive film does not adhere stably to the surface of the insulating layer, the power supply becomes insufficient. If the via formation hole is filled with metal by electroplating, defects, such as voids or seams, may be caused in the metal with which the hole is filled. As a result, interlayer connection may be unstable and there is a risk that a failure occurs in the interconnects. If electroplating is not used, the conductive film is not provided stably on the surface of the insulating layer and thus there is a risk that poor conduction is caused in the interlayer connection.

SUMMARY OF THE INVENTION

A wiring board according to an aspect of the present invention includes: a substrate that includes a resin containing a plurality of fillers; and a via that is electrically connected to at least one interconnect provided to the substrate, wherein the via includes a mix area in which metal is provided between the fillers on an inner radial side with respect to the substrate.

A method of manufacturing a wiring board according to another aspect of the present invention includes: preparing a substrate that includes a resin containing a plurality of fillers; forming a via formation hole in the substrate; performing an ashing process on at least an inner wall of the via formation hole; and performing electroless plating on the inner wall of the via formation hole.

An electronic component embedded substrate according to still another aspect of the present invention includes: a substrate that includes a resin containing a plurality of fillers; and a via that is electrically connected to at least one interconnect provided to the substrate, wherein the via includes a mix area in which metal is provided between the fillers on the inner radial side with respect to the substrate and the via is electrically connected to an electronic component embedded in the resin.

An electronic component embedded substrate according to still another aspect of the present invention includes: a resin layer that has a resin containing a plurality of fillers; an electronic component superposed on the resin layer; and a via that is provided to the resin layer, wherein the via includes a mix area in which metal is provided between the fillers on the inner radial side with respect to the substrate and the via is electrically connected to the electronic component.

A method of manufacturing an electronic component embedded substrate according to still another aspect of the present invention includes: superposing a resin layer that includes a resin containing a plurality of fillers on an electronic component; forming a via formation hole in the resin layer; performing an ashing process on at least an inner wall of the via formation hole; and performing electroless plating on the inner wall of the via formation hole.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Embodiments of the present invention will be described in detail below with reference to the accompanying drawings. The following descriptions of the embodiments do not limit the invention. The following elements described in the embodiments include elements that those skilled in the art could easily conceive and elements substantially the same, i.e., equivalents. Furthermore, the elements described in the embodiments can be appropriately combined.

First Embodiment

Figure 1:
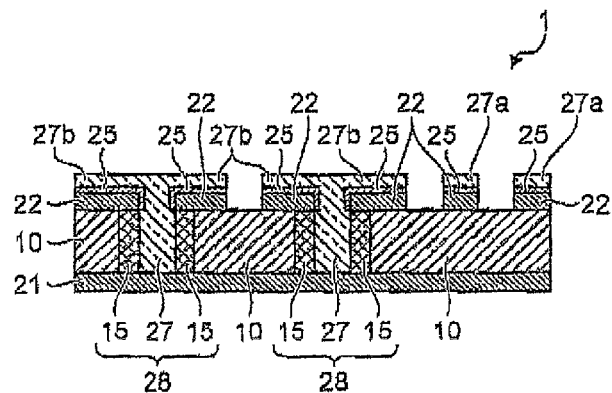
FIG. 1 is a cross-sectional view illustrating a wiring board according to an embodiment.

FIG. 1 is a cross-sectional view illustrating a wiring board according to a first embodiment. As shown in FIG. 1, a wiring board (wiring circuit board) 1 includes a substrate 10, a first interconnect layer 21, a second interconnect layer 22, a third interconnect portion 27a, a land 27b, a via 28, and an intermediate metal layer 25. The via 28 includes a filled via 27 and a mix layer 15.

The substrate 10 is a plate-like member on which interconnects for configuring a circuit are formed. The substrate 10 is formed from an insulating material, such as a resin. The substrate 10 is formed from a composite material obtained by mixing a filler into the insulating material. As for the percentage of the filler relative to the resin, if, for example, the resin is epoxy resin and the filler is silicon dioxide ($SiO_2$), the percentage content of the filler is between 50% and 76% by volume (between 70% and 85% by mass) relative to the resin. It is more preferable that the percentage of the filler mixed into the resin be 55% or more, by volume, relative to the resin.

As for the percentage of the filler, the percentage of the filler (% by area) can be calculated by processing an image by randomly taking areas in some points and calculating the percentage of the filler. The percentage of the filler (% by area) is in the same range as that of the above-described percentage content of the filler (% by volume).

As the resin material that forms the substrate 10, various types of insulating resin materials that can be formed to be sheet-like or film-like can be used. Examples of resin material that form the substrate 10 are vinylbenzyl resin, polyvinyl benzyl ether compound resin, bismaleimide triazine resin (BT resin), polyphenyl ether (polyphenylene ether oxide) resin (PPE, PPO), cyanate ester resin, epoxy resin, epoxy+active ester cured resin, polyolefin resin, benzo cyclobutene resin, polyimide resin (aromatic), polyester resin, (aromatic) liquid crystal polyester resin, polyphenylene oxide resin, polyphenylene sulfide resin, polyetherimide resin, polyacrylate resin, polyether ether ketone resin, fluorine resin, phenol resin, liquid crystal polymer, silicone resin, and benzo-oxazine resin, or resin that partly contains a rubber material, such as acrylic rubber or ethylene-acrylic rubber. For the resin material that forms the substrate 10, the above-described resins may be used singularly. Alternatively, a material can be used that is obtained by mixing, with any one of the above-listed resins, resin fibers such as glass fibers or aramid fibers or a material can be used that is obtained by impregnating, with any one of the above-listed resins, a glass cloth, aramid fibers, or nonwoven fabrics. The above-described resins may be used independently or in combination. For the substrate 10, a material can be appropriately selected from the above-described materials and used for their electrical properties, mechanical properties, water absorbability, and reflow resistance.

Various types of materials can be used as the material for the filler. The material of the filler is, for example, at least one of silicon oxide ($SiO_2$), talc, calcium carbonate, magnesium carbonate, aluminum hydroxide, magnesium hydroxide, aluminum borate whiskers, potassium titanate fibers, alumina, glass flakes, glass fibers, tantalum nitride, aluminum nitride, and boron nitride, or metal-oxide powders containing at least one of magnesium, silicon, titanium, zinc, calcium, strontium, zirconium, tin, neodymium, samarium, aluminum, bismuth, lead, lanthanum, lithium, and tantalum. The above-described materials may be used singularly or in combination. The filler may be appropriately selected from the above-described materials and used for their electric properties, mechanical properties, water absorbability, and reflow resistance. In addition to the filler, another additive, such as a stabilizer, may be added.

For the mix layer 15, it is preferable that the shape of the filler is spherical. For example, the average diameter of particles of the filler is desirably between 0.6 μm and 3.0 μm. The average particle diameter of the filler is more preferably between 1.0 μm and 2.0 μm. If the average particle diameter of the filler is between 1.0 μm and 2.0 μm, the unevenness of the surface of the substrate becomes flat, which improves the accuracy of processing, such as hole processing. If the average particle diameter of the filler is between 1.0 μm and 2.0 μm, percentage content of the filler can be, for example, 76% by volume. In other words, by changing the average particle diameter of the filler, the volume of the filler can be increased. The average particle diameter can be measured, for example, by using an apparatus (LA-920) manufactured by Horiba, Ltd. and laser diffraction (scattering). The circularity of the filler is preferably 0.7 or more and more preferably 0.8 or more.

The first interconnect layer 21 is formed on one surface of the substrate 10. The first interconnect layer 21 is formed from a conductive material and is arranged on one surface of the substrate 10. The second interconnect layer 22 is formed on the surface of the substrate 10 on the side opposite to the surface on which the first interconnect layer 21 is formed. The first interconnect layer 21 and the second interconnect layer 22 are interconnect patterns having a predetermined thickness and are formed from a conductive material. The third interconnect portion 27a is an interconnect formed on a conductive material and is thicker than the second interconnect layer 22. The third interconnect portion 27a is deposited, as an interconnect portion having a predetermined thickness, on the second interconnect layer 22 via the intermediate metal layer 25, which will be described below. The third interconnect portion 27a can be made by, for example, plating.

Examples of metal that can be used for the first interconnect layer 21, the second interconnect layer 22, and the third interconnect portion 27a are gold (Au), silver (Ag), copper (Cu), nickel (Ni), tin (Sn), chrome (Cr), aluminum (Al), tungsten (W), iron (Fe), stainless, and titanium (Ti). It is preferable that copper (Cu) be used for its electroconductivity and cost.

The land 27b is a portion formed corresponding to the filled via 27, which will be described below. The land 27b is formed from a conductive material, such as metal (the same metal as that for the third interconnect portion 27a). In the land 27b, the area of the land 27b on the surface on the side opposite to the land 27b is larger than that of the filled via 27 with which the land 27b makes contact. The land 27b may be formed as a semi-sphere by further applying metal such that it serves as an external connection terminal.

The intermediate metal layer 25 is formed from a conductive material, such as metal. The intermediate metal layer 25 firmly adheres the third interconnect portion 27a and the land 27b to the second interconnect layer 22. The intermediate metal layer 25 is preferably a metal on which electroless plating can be performed. For the intermediate metal layer 25, for example, copper (Cu), silver (Ag), nickel (Ni), cobalt (Co), tin (Sn), rhodium (Rh), palladium (Pd), gold (Au) or an alloy of the above-described metals can be used.

The filled via 27 is formed so as to penetrate the substrate 10 and to be column-shaped. One end of the filled via 27 is electrically connected to at least the land 27b and the other end is electrically connected to the first interconnect layer 21. Because of this structure, the filled via 27 allows electrical conduction between the land 27b, with which the filled via 27 makes contact, and the second interconnect layer 22, which is connected to the filled via 27 via the intermediate metal layer 25. The land 27b is connected to the first interconnect layer 21. Accordingly, the filled via 27 allows conduction between a part of the first interconnect layer 21 and a part of the second interconnect layer 22 via the land 27b.

Examples of metal that can be used for the filled via 27 are gold (Au), silver (Ag), copper (Cu), nickel (Ni), tin (Sn), chrome (Cr), aluminum (Al), tungsten (W), iron (Fe), stainless, titanium (Ti). It is preferable that copper (Cu) be used for its electroconductivity and cost. Forming the metal used for the filled via 27 by electrolytic plating is preferable because of its forming speed. Furthermore, solder can be used as the metal used for the filled via 27. The material used for the filled via 27 is a conductive material. A conductive paste may be used to fill the filled via 27.

Figure 2:
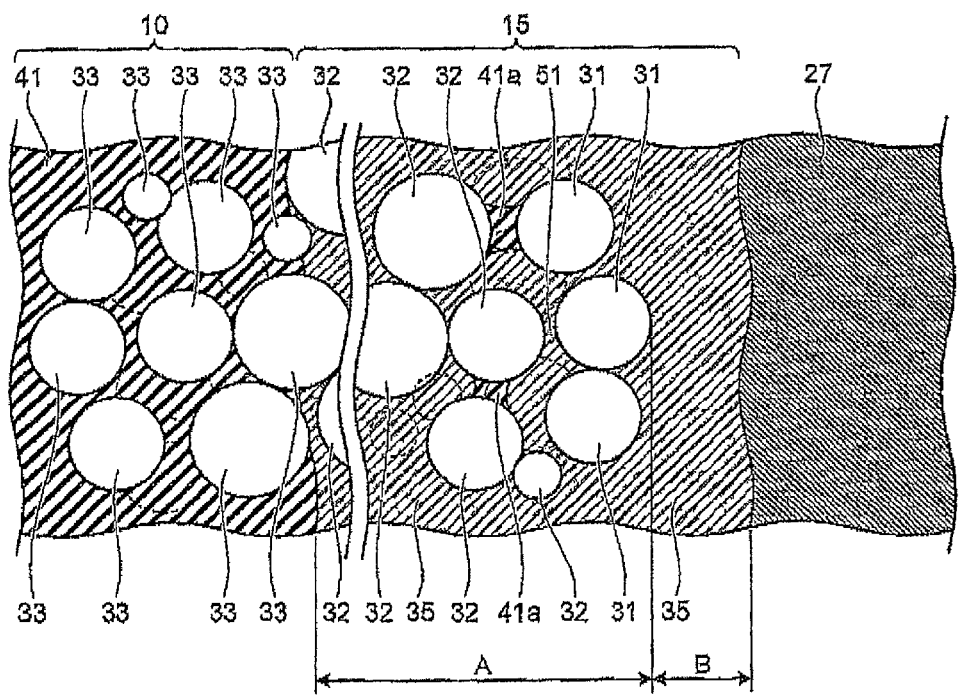
FIG. 2 is a partial cross-sectional view schematically illustrating a mix layer.

FIG. 2 is a partial cross-sectional view schematically illustrating the mix layer. The mix layer 15 will be described using FIGS. 1 and 2. To clarify the relationship between the substrate 10, the mix layer 15, and the filled via 27, illustration thereof is partly omitted in FIG. 2.

As shown in FIG. 1, the mix layer 15 is arranged between the substrate 10 and the surface of the filled via 27 so as to radially surround the circumference of the filled via 27. The mix layer 15 is arranged so as to extend from the surface of the first interconnect layer 21 to the surface of the second interconnect layer 22 (i.e., from one surface of the substrate 10 to the other surface) in the thickness direction of the substrate 10. The via 28 has a mix area A in which metal is provided between a plurality of fillers 31 and 32 on the inner radial side with respect to the substrate 10. There is an adherence area B on the inner radial side with respect to the substrate 10 and between the mix area A and the filled via 27.

The substrate 10 shown in FIG. 2 is formed, as described above, by mixing a resin 41 and a filler 33. The mix layer 15 contains the mix area A and the adherence area B. The adherence area B may be eliminated. The mix area A contains at least the fillers 31 and 32 that are formed from the same material as that of the filler 33 of the substrate 10 and further contains at least a conductive layer 35 that is a conductive material, such as a metal. The thickness of the mix area A is the thickness of the via in the radial direction.

In the mix area A, the resin 41 remains as a neck resin 41a. Thus, the neck resin 41a is the same material as that of the resin 41 of the substrate 10. In the mix area A, because the volume of the resin 41 is less than that of the substrate 10, not all the spaces between the fillers are filled with the resin 41.

When there is no conductive layer 35, there are the neck resin 41a and a filler space 51 between the filler 31 and the filler 32 in the mix area A. The filler space 51 is an air gap caused because there is no resin 41 between the filler 31 and the filler 32.

The filler 31 of the mix layer 15 shown in FIG. 2 is positioned on the side closest to the filled via 27. The filler 32 is positioned, relative to the filler 31, on the side away from the filled via 27. When there is no conductive layer 35, the filler 31 is joined to the filler 32 by the neck resin 41a somewhere in the space on the circumference of the filler 31. For example, it is thought that the neck resin 41a serves as a neck portion lying between the filler 31 and the filler 32 and the filler 31 is fixed to the filler 32. Similarly, the fillers 31 are joined to each other and the fillers 32 are joined to each other via the neck resin 41a.

The conductive layer 35 is preferably a conductive material and is a metal on which electroless plating can be performed. For the conductive layer 35, copper (Cu), silver (Ag), nickel (Ni), cobalt (Co), tin (Sn), rhodium (Rh), palladium (Pd), gold (Au), or an alloy of the above-described metals can be used.

At least the conductive material of the conductive layer 35 is provided in the filler space 51 lying between the filler 31 and the filler 32. Furthermore, the conductive material of the conductive layer 35 is provided in the air gap between the fillers 32. The percentage content of the fillers that is the percentage of the mix area A occupied by the filler 31 and the filler 32 is the same value as that of the percentage content of the fillers of the substrate 10. Thus, the percentage content of the fillers in the mix area A is preferably 45% or more. If the percentage content of the fillers is 45% or more, the volume of the fillers increases and thus the adherence area B adheres stably. A percentage content of the fillers of between 50% and 90% is more preferable because it reduces variations, such as dropping off of the fillers.

The adherence area B is an area where the conductive layer 35 is provided on the surface of the filler 31 on the side of the filled via 27. In the adherence area B, conduction is allowed between the conductive member of the conductive layer 35, which lies between the filler 31 and the filler 32, and the conductive material, which is provided on the surface of the filler 31 on the side of the filled via 27.

The conductive layer 35 that is provided on the surface of the filler 31 and in the filler space 51 is arranged so as to extend from the surface of the first interconnect layer 21 to the surface of the second interconnect layer 22 (i.e., from one surface of the substrate 10 to the other surface). Accordingly, the mix layer 15 can electrically connect the first interconnect layer 21 and the second interconnect layer 22. When the filled via 27 is formed by electroplating, the conductive layer 35 provided on the surface of the filler 31 and in the filler space 51 functions as an electron carrier during the electroplating.

The wiring board 1 according to the first embodiment includes the substrate 10 that includes the resin containing the fillers and the via that allows interlayer connection between the first interconnect layer 21 and the second interconnect layer 22 that are interconnects with which the substrate 10 is provided. The via includes the mix layer 15 that contains the mix area A in which the metal is provided in the filler space 51, which is formed between the fillers, on the inner radial side with respect to the substrate.

In the wiring board 1 according to the first embodiment, the filled via 27 and the conductive layer 35 of the mix layer 15 together serve as the via 28, which can electrically connect the first interconnect layer 21 and the second interconnect layer 22. Even if there is only the mix area A, the first interconnect layer 21 and the second interconnect layer 22 can be electrically connected to each other. As a result, even if the via has a high aspect ratio and thus the adherence area B of the mix layer 15 is small near the bottom of the via formation hole, electrical interlayer connection is allowed and a low-resistance interconnect can be obtained. Here, the aspect ratio is the ratio of the depth of the via formation hole to the diameter of the via formation hole.

In the wiring board 1 according to the first embodiment, because the connection resistance of the via 28 is smaller than that of only the filled via 27, a low-resistance interconnect can be obtained. Furthermore, when the filled via 27 is formed by electroplating, there is the conductive layer 35, as an electron carrier, that extends from the surface of the first interconnect layer 21 to the surface of the second interconnect layer 22 (i.e., from one surface of the substrate 10 to the other surface) in the wiring board 1. Thus, the via 28 of the wiring board 1 can reduce defects, such as voids or seams. As a result, the via 28 allows stable interlayer connection, which reduces the risk of failure in the interconnect.

Even if the aspect ratio of the via, which is the ratio of the via depth to the via diameter, is larger than 1, the wiring board 1 according to the first embodiment allows a stable interlayer connection and reduces the risk of interconnect failure. For example, the wiring board 1 according to the first embodiment can be manufactured without causing any interconnect failure in a range of the diameter of the via 28 of between $\phi 5$ μm and $\phi 200$ μm and with an aspect ratio that satisfies this inequality: $1 < \text{aspect ratio} \leq 6$.

The via 28 of the wiring board 1 according to the first embodiment includes the filled via 27, i.e., has a filled via structure. However, in the first embodiment, the via 28 of the wiring board 1 is not limited to the filled via structure. A conformal via structure without the filled via 27 may be used so that the first interconnect layer 21 and the second interconnect layer 22 are electrically connected to each other via only the mix layer 15.

FIGS. 3A to 3F are illustrative diagrams illustrating an example of a method of manufacturing a wiring board according to the first embodiment. FIG. 4 is a flowchart illustrating an example of the method of manufacturing a wiring board according to the first embodiment. The method of manufacturing a wiring board according to the first embodiment will be described with reference to FIGS. 3A to 3F and FIG. 4. The wiring board 1 according to the first embodiment can be manufactured by using a manufacturing apparatus that has various functions, such as a manipulator, a semiconductor processing function, plasma processing, and etching processing. The manufacturing apparatus may be separated into multiple devices. Transfer between the devices and setting of parts may be performed by an operator.

Figure 3A:
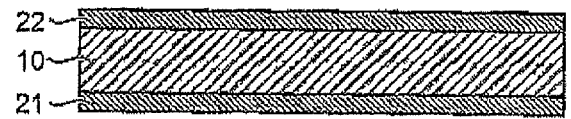
FIG. 3A is an illustrative diagram illustrating an example of a method of manufacturing a wiring board according to the embodiment.
Figure 4:
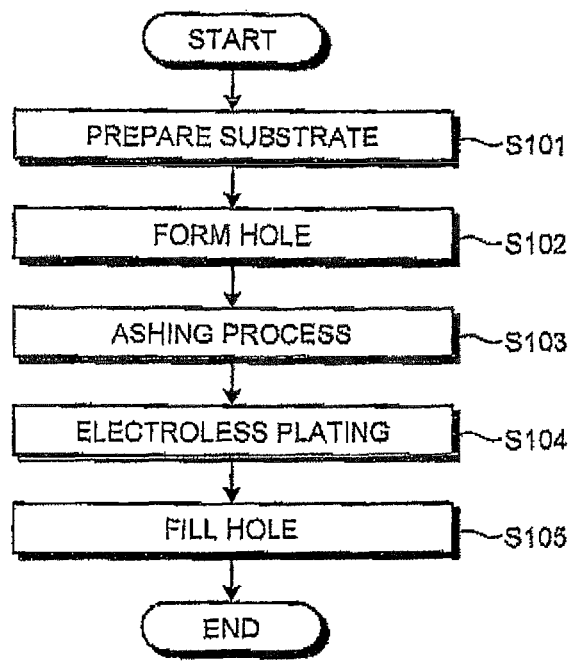
FIG. 4 is a flowchart illustrating the example of the example method of manufacturing a wiring board according to the embodiment.

As shown in FIG. 3A and FIG. 4, first, the substrate 10 is prepared (step S101). One surface of the substrate 10 is provided with a metal film (metal foil), so that the first interconnect layer 21 is formed. The other surface of the substrate 10 is provided with a metal film (metal foil), so that the second interconnect layer 22 is formed. For the metal films, for example, gold (Au), silver (Ag), copper (Cu), nickel (Ni), tin (Sn), chrome (Cr), aluminum (Al), or tungsten (W) can be used. The thickness of the metal film (metal foil) may be between 0.1 μm and 12 μm.

Figure 3B:
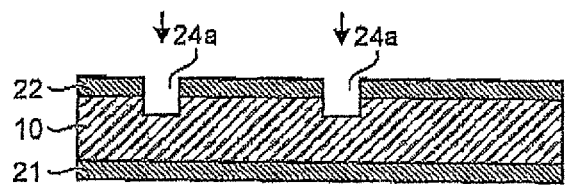
FIG. 3B is an illustrative diagram illustrating the example of the method of manufacturing a wiring board according to the embodiment.
Figure 3C:
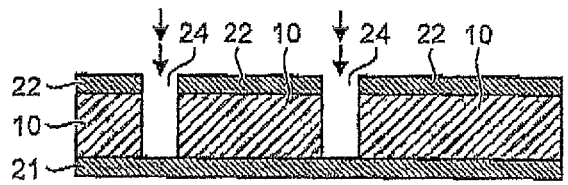
FIG. 3C is an illustrative diagram illustrating the example of the method of manufacturing a wiring board according to the embodiment.

As shown in FIG. 3B, FIG. 3C, and FIG. 4, holes for forming vias in the substrate 10 are formed (step S102). The manufacturing apparatus then irradiates predetermined positions from the side of the second interconnect layer 22 of the substrate 10 shown in FIG. 3B with a UV-YAG laser or a direct $CO_2$ laser, thereby forming via formation holes 24a. The via formation holes 24a penetrate the second interconnect layer 22 and extend to part of the substrate 10.

The manufacturing apparatus then further deepens the formed via formation holes 24a by using, for example, a $CO_2$ laser or a UV-YAG laser, so that, as illustrated in FIG. 3C, the via formation holes 24a reach the first interconnect layer 21 and the via formation holes 24 are formed. The via formation holes 24 reach the first interconnect layer 21. The via formation holes 24 do not penetrate the first interconnect layer 21. The via formation hole 24 is a hole in which the filled via 27 is formed. The via formation holes 24 are formed by two steps in the first embodiment, but the present invention is not limited to this. The via formation holes 24 may be formed in one step, three steps, or more.

Figure 3D:
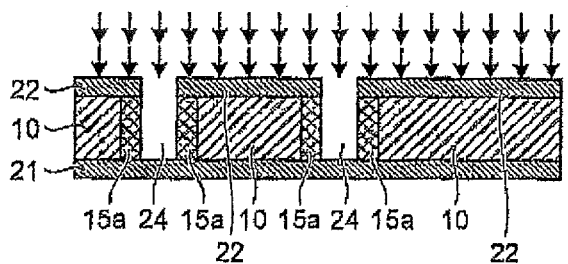
FIG. 3D is an illustrative diagram illustrating the example of the method of manufacturing a wiring board according to the embodiment.

As shown in FIG. 3D and FIG. 4, an ashing process is performed on the inner wall of the holes, which are formed in the substrate 10 (step S103). The manufacturing apparatus preferably includes a plasma device that performs the ashing process on the surface of the inner wall of the via formation holes 24. The ashing process is performed according to the following procedure. First, the substrate 10 in which the via formation holes 24 are formed is held in the plasma device. As shown in FIG. 3D, in the plasma device, the substrate 10 is arranged in a plasma gas kept at a predetermined pressure (for example, 100 MPa) with a predetermined power supply (for example, 3 kw) and the substrate 10 is exposed to the plasma gas. Accordingly, the plasma gas in which the plasma discharge occurs acts on the surface of the inner wall of the via formation holes 24. A part of the resin 41, which is contained in the substrate 10 shown in FIG. 2, is mainly oxidized by oxygen plasma gas (hereinafter, "ashing") and then is scattered as carbon dioxide ($CO_2$). Accordingly, the filler space 51 shown in FIG. 2 appears and a part of the resin 41 remains as the neck resin 41a, so that the fillers are connected to each other. As shown in FIG. 3D, the part corresponding to a predetermined depth from the surface of the inner wall of the via formation hole 24 serves as a porous layer 15a that contains the filler space 51 and the neck resin 41a shown in FIG. 2.

The plasma gas that is contained in the plasma gas atmosphere is preferably any one or more of carbon tetrafluoride ($CF_4$), carbonyl fluoride (COF), hexafluoroethane ($C_2F_6$), octafluoropropane ($C_3F_8$), and perfluorocyclobutane ($c-C_4F_8$) or a mixed gas of any one or more of the gases and oxygen ($O_2$). The plasma gas may contain nitrogen ($N_2$) and argon (Ar) that are inert gases. It is desirable that the plasma gas be a mixed gas of tetrafluoride ($CF_4$) and oxygen ($O_2$) or a mixed gas of carbonyl fluoride (COF) and oxygen ($O_2$).

As a plasma condition for the plasma apparatus, the fluorine gas component is mixed with oxygen gas such that ashing can be performed efficiently. The ashing level of the fluorine gas component changes depending on its physical properties. In the case of the mixed gas of tetrafluoride ($CF_4$) and oxygen ($O_2$), by keeping the percentage of tetrafluoride ($CF_4$) in the entire volume of flow in a range between 2.5% and 20%, the fillers are held in the porous layer 15a. Regarding the plasma condition for the plasma apparatus, if the entire percentage volume of tetrafluoride ($CF_4$) gas with respect to the entire percentage volume is less than 2.0%, the ashing efficiency decreases and time is required to form the porous layer 15a, and thus the porous layer 15a cannot be manufactured efficiently. Regarding the plasma condition for the plasma apparatus, if the percentage volume of $CF_4$ is more than 20%, the volume of oxygen plasma decreases, so that the porous layer 15a cannot be formed efficiently.

Figure 3E:
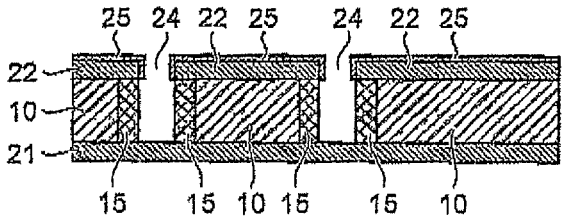
FIG. 3E is an illustrative diagram illustrating the example of the method of manufacturing a wiring board according to the embodiment.

As shown in FIG. 3E and FIG. 4, electroless plating is performed on the inner wall of the holes, which are formed in the substrate 10 (step S104). The manufacturing apparatus forms the conductive layer 35 shown in FIG. 2 on the surface of the inner wall of the via formation holes 24 by electroless plating. As shown in FIG. 3E and FIG. 2, a plating solution flows into the filler space 51 in the porous layer 15a so that the filler space 51 is filled with the conductive layer 35. It is not necessary to fill the whole filler space 51 with the conductive layer 35. A part of the filler space 51 may be a gap. As shown in FIG. 2, because the surface of the filler 31 is also soaked with the plating solution, the conductive layer 35 also adheres to the surface of the filler 31. Accordingly, the porous layer 15a serves as the mix layer 15 as shown in FIG. 2.

As illustrated in FIG. 3E, the intermediate metal layer 25 is formed on the second interconnect layer 22 simultaneously when the metal film is formed on the surface of the inner wall of the via formation holes 24 by electroless plating. Thus, in the first embodiment, the intermediate metal layer 25 is made of the same material as that of the conductive layer 35. If the adherence is valued, the intermediate metal layer 25 may be made of a material different from that of the conductive layer 35 by performing sputtering. During electroless plating, it is possible not to provide the intermediate metal layer 25 on the second interconnect layer 22 by previously covering the second interconnect layer 22 with, for example, a resist.

Figure 3F:
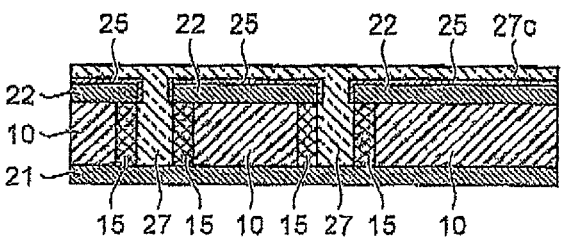
FIG. 3F is an illustrative diagram illustrating the example of the method of manufacturing a wiring board according to the embodiment.

Thereafter, as shown in FIG. 3F and FIG. 4, the holes that are formed in the substrate 10 are filled with a conductive material (step S105). As shown in FIG. 3F, the manufacturing apparatus grows the metal film by electroplating to form the filled vias 27 that are made of the conductive material. The conductive material that serves as the filled via 27 may be the same type of metal with which electroless plating is performed on the inner wall of the holes at step S104 or a different type of metal. The filled via 27 is formed by filling in the via formation holes 24 so as to cover the whole surface of the substrate 10 on the side of the second interconnect layer 22. The metal film that is formed on the surface of the intermediate metal layer 25 by the above-described electroplating serves as a third interconnect layer 27c. It is preferable that annealing is then performed by using a heating process. This reduces detachment of the mix layer 15 by an external force.

The manufacturing apparatus then provides a certain resist on the surface of the third interconnect layer 27c. After exposing the resist and developing the resist, the manufacturing apparatus performs an etching process on a part of the third interconnect layer 27c, thereby forming an interconnect pattern (subtractive method). For example, when the third interconnect portion 27a and the land 27b are formed, the second interconnect layer 22, the intermediate metal layer 25, and the third interconnect layer 27c are etched according to a predetermined interconnect pattern so that the above-described wiring board 1 is obtained. As a method of forming the third interconnect portion 27a and the land 27b, there is a method (semi-additive method) in which the areas for the third interconnect portion 27a and the land 27b are originally divided in a way that, after the second interconnect layer 22 is previously formed by using a conductive base layer and a plating resist is formed on which a desired patterning is performed, copper electroplating is performed. In the first embodiment and the embodiments described below, a subtractive method or a semi-additive method can be used for patterning of interconnect layers, terminal electrodes, bumps, and electrodes.

As described above, the method of manufacturing a wiring board according to the first embodiment includes a step of preparing the substrate 10 that has one surface on which the first interconnect layer 21 is arranged and another surface on which the second interconnect layer 22 is arranged and that includes the resin containing the fillers; a step of forming the via formation hole 24 that penetrates the second interconnect layer 22 and the substrate 10 and that extends to the first interconnect layer 21; a step of performing the ashing process on at least the inner wall of the via formation hole 24 by plasma processing; and a step of performing electroless plating using the metal that serves as the conductive layer 35 on the via formation hole 24. The resin 41 containing the fillers 31 and 32 is processed by performing the plasma processing so that it becomes the porous layer 15a and electroless plating is then performed on the porous layer 15a. As a result, the wiring board 1, which is manufactured by the method of manufacturing a wiring board according to the first embodiment, allows electrical interlayer connection and a low-resistance interconnect can be obtained. When the filled via 27 is formed by electroplating, the mix area A of the mix layer 15 functions as an electron carrier for electroplating, which reduces defects of the filled via 27. As a result, the method of manufacturing a wiring board according to the first embodiment can improve reliability of interlayer connection. Thus, the wiring board 1 with a low risk of malfunction and high reliability can be manufactured. In a method of manufacturing a wiring board of a modification, the second interconnect layer may be omitted in the process of preparing a substrate (step S101) and an interconnect pattern can be formed on the top (the portion corresponding to the second interconnect layer 22) simultaneously at the following step (step S105) of filling the holes formed in the substrate 10 with the conductive material.

In the method of manufacturing a wiring board according to the first embodiment, when the filled via 27 is formed by electroplating, the mix area A functions as an electron carrier for electroplating, which reduces defects of the filled via. As a result, reliable interlayer connection can be achieved; therefore, the wiring board 1 manufactured by the method of manufacturing a wiring board according to the first embodiment has a low risk of malfunction and is highly reliable.

Figure 5:
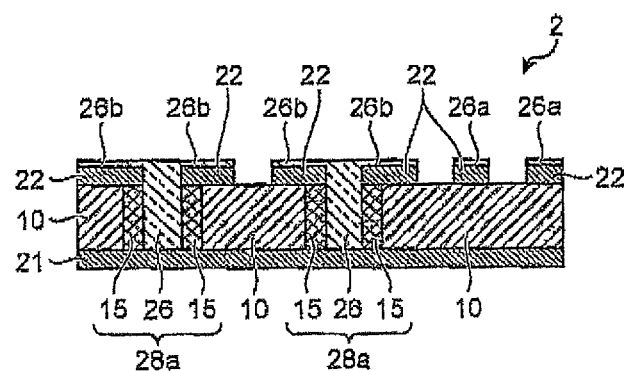
FIG. 5 is a cross-sectional view illustrating a modification of the wiring board according to the embodiment.

FIG. 5 is a cross-sectional view illustrating a modification of the wiring board according to the first embodiment. In the first embodiment, a case is described in which the filled via is formed by electroplating. A wiring board 2 according to the modification is characterized by the fact that the filled via 27 shown in FIG. 3F is formed only by electroless plating so as to serve as a filled via 26. A via 28a of the wiring board 2 includes the filled via 26 and the mix layer 15. The wiring board 2 includes a third interconnect portion 26a and a land 26b that are formed from the same material as that of the filled via 26. In the step of filling in the holes formed in the substrate 10 (step S105) of the wiring board 2 according to the modification, the filled via 26 is formed only by electroless plating and the via formation holes 24 are filed with a metal that is a conductive material. Because a resin containing a plurality of fillers serves as a porous layer and the porous layer is impregnated with a plating solution for electroless plating, if electroless plating is continued, the conductive material is used for the filling by electroless plating so as to cover the metal with which the porous layer is impregnated, so that the porous layer and the conductive material are integrated. Accordingly, defects of the filled via can be reduced. The conductive material that serves as the filled via 26 may be the same type of metal as that with which electroless plating is performed on the inner wall of the holes or a different type of metal. The condition for the electroless plating on the filled via 26 may be different from the condition for electroless plating on the porous layer.

Second Embodiment

Figure 6:
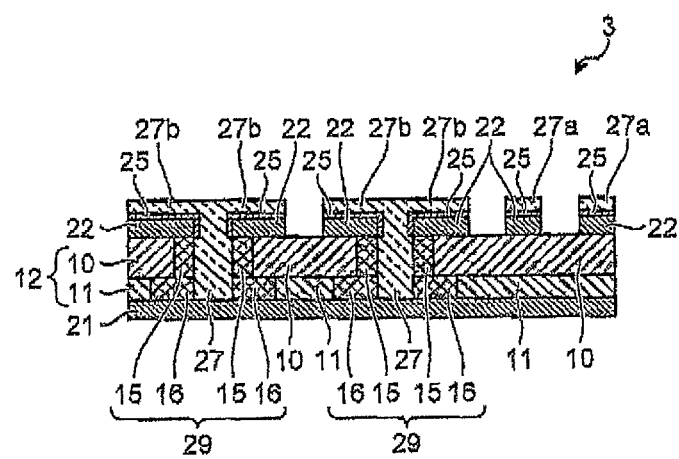
FIG. 6 is a cross-sectional view illustrating the wiring board according to an embodiment.

FIG. 6 is a cross-sectional view illustrating a wiring board according to a second embodiment. The wiring board and a method of manufacturing a wiring board according to the second embodiment are characterized by the fact that a laminated substrate is used in which a plurality of substrates each containing a plurality of fillers are superposed in the thickness direction of the substrates and in which the percentage content of the fillers is different for each of the superposed substrates. In the following descriptions, the same elements as those of the first embodiment are denoted by the same reference numerals as those of the first embodiment and redundant descriptions will be omitted.

As shown in FIG. 6, a wiring board (wiring circuit board) 3 includes a laminated substrate 12, the first interconnect layer 21, the second interconnect layer 22, the third interconnect portion 27a, a via 29, the land 27b, and the intermediate metal layer 25. The laminated substrate 12 includes the substrate 10 and a substrate 11. The via 29 includes the filled via 27, the mix layer 15, and a mix layer 16.

The laminated substrate 12 is a laminated substrate in which the substrate 10 and the substrate 11 are superposed in their thickness direction. The substrate 10 is a substrate that, as described above, includes a resin containing a plurality of fillers. The substrate 11 is a plate-like member on which interconnects that serve as a circuit are formed. Like the substrate 10, the substrate 11 is formed from an insulating material, such as, a resin. The substrate 11 is made from a composite material obtained by mixing fillers into the insulating material. The percentage of the fillers relative to the resin in the substrate 11 is larger than the percentage of the fillers relative to the resin in the substrate 10.

For example, if the resin of the substrate 11 is epoxy resin and the fillers are silicon dioxide ($SiO_2$), the percentage content of the fillers is between 50% and 76% by volume (between 70% and 85% by mass) relative to the resin. Note that the percentage content of the fillers relative to the resin in the substrate 11 is in a range such that it is smaller than the percentage content of the fillers relative to the resin in the substrate 10.

For example, if the percentage of the fillers relative to the resin in the substrate 10 is 50% by volume (70% by mass) and the percentage of the fillers relative to the resin in the substrate 11 is 62% by volume (75% by mass), the mix layer 15 and the mix layer 16 are formed in the substrate 10 and the substrate 11. Like the mix layer 15 in FIG. 2, the mix layer 16 includes an area that contains at least the fillers 31 and 32, which are formed from the same material as that of the filler 33 of the substrate 10, and further contains at least the conductive layer 35.

There is a trend that, if the percentage of the fillers relative to the resin is large, the filler space 51 shown in FIG. 2 is formed even inside the substrate and thus the mix layer is thick in the radial direction of the via. Thus, the mix layer 16 is thicker than the mix layer 15 in the radial direction of the via of the mix layer. An increase in the aspect ratio makes it difficult to adhere a conductive film stably on the surface of the insulating layer in the via near the bottom of a via formation hole for forming a via. The reason of this is that, during electroless plating, an increase in the aspect ratio decreases the adherence of the plating near the bottom of the via formation hole.

In the wiring board 3 according to the first embodiment, the laminated substrate, in which the substrates each containing the fillers are superposed in the thickness direction of the substrates and in which the percentage content of the fillers is different for each of the superposed substrates, serves as a substrate that includes a resin containing a plurality of fillers. Furthermore, the substrate 11 having the larger percentage content of the fillers is arranged on the side of the bottom of the via formation hole in which the via is formed.

An increase in the percentage content of the fillers increases the thickness of the mix area. For this reason, by arranging the substrate 11 having a large thickness of the mix area in the radial direction of the via on the bottom of the via formation hole, a via having a greater aspect ratio can be formed. If the thickness of the mix area in the radial direction of the via is large, a plating solution flows into the filler space 51 between fillers, which allows the plating to be easily fixed to the mix area. A conductive layer that functions as an electron carrier is formed stably on the bottom of the via formation hole. As a result, in the wiring board 3 according to the second embodiment, by forming the mix layer 16 near the bottom of the via formation hole when the via is formed, defects of the filled via 27 can be reduced even if the aspect ratio is high.

In the wiring board 3, because the first interconnect layer 21 and the second interconnect layer 22 can be electrically connected to each other by the via 29 that includes the filled via 27, the mix layer 15, and the mix layer 16, the connection resistance between the first interconnect layer 21 and the second interconnect layer 22 decreases. Thus, a lower-resistance interconnect can be obtained. Furthermore, there is the conductive layer 35 that extends from the surface of the first interconnect layer 21 to the surface of the second interconnect layer 22 (i.e., from one surface on the substrate 11 to the other surface on the substrate 10). Thus, when the filled via 27 is formed by electroplating, the conductive layer 35 can reduce defects, such as voids or seams, of the filled via 27. Accordingly, interlayer connection can be stable, which reduces a risk of failure in the interconnect.

The wiring board 3 includes the filled via 27, i.e., has a filled via structure. However, the second embodiment is not limited to the filled via structure. A conformal via structure without the filled via 27 may be used so that the first interconnect layer 21 and the second interconnect layer 22 are electrically connected to each other via only the mix layer 15 and the mix layer 16. The method of manufacturing a wiring board according to the second embodiment will be described.

FIGS. 7A to 7F are illustrative diagrams illustrating an example of a method of manufacturing a wiring board according to the second embodiment. The method of manufacturing a wiring board according to the second embodiment will be described with reference to FIGS. 7A to 7F and FIG. 4.

Figure 7A:
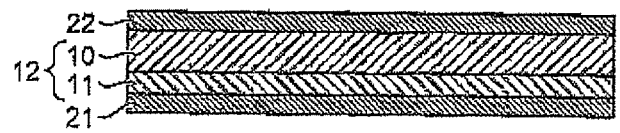
FIG. 7A is an illustrative diagram illustrating an example of a method of manufacturing a wiring board according to the embodiment.

As shown in FIG. 7A and FIG. 4, first, the laminated substrate 12 in which the substrate 10 is superposed on the substrate 11 is prepared (step S101). A metal film (metal foil) is arranged on one surface of the substrate 11, so that the first interconnect layer 21 is formed. The substrate 10 is superposed with its one surface on the other surface of the substrate 11. A metal film (metal foil) is arranged on the other surface of the substrate 10, so that the second interconnect layer 22 is formed.

Figure 7B:
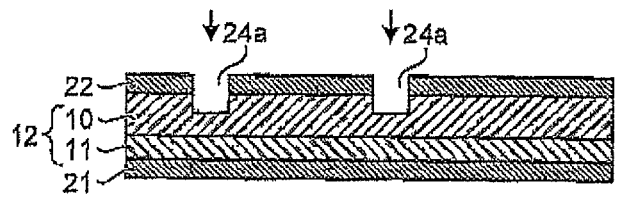
FIG. 7B is an illustrative diagram illustrating the example of the method of manufacturing a wiring board according to the embodiment.
Figure 7C:
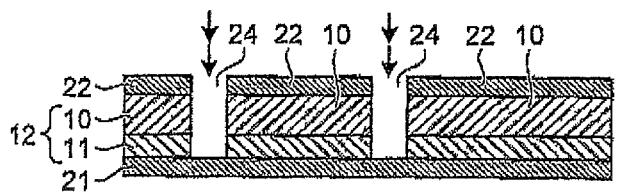
FIG. 7C is an illustrative diagram illustrating the example of the method of manufacturing a wiring board according to the embodiment.

As shown in FIG. 7B, FIG. 7C, and FIG. 4, holes for forming vias in the laminated substrate 12 are formed (step S102). The manufacturing apparatus irradiates predetermined positions from the side of the second interconnect layer 22 of the substrate 10 shown in FIG. 7B with a UV-YAG laser or a direct $CO_2$ laser, thereby forming the via formation holes 24a. The via formation holes 24a penetrate the second interconnect layer 22 and extend to a part of the substrate 10.

The manufacturing apparatus then further deepens the formed via formation holes 24a by using, for example, a $CO_2$ laser or a UV-YAG laser, so that, as illustrated in FIG. 7C, the via formation holes 24a reach the first interconnect layer 21 and the via formation holes 24 are formed.

Figure 7D:
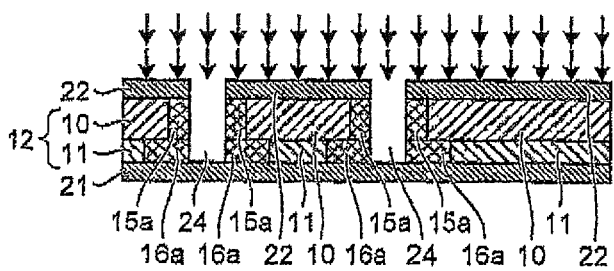
FIG. 7D is an illustrative diagram illustrating the example of the method of manufacturing a wiring board according to the embodiment.

As shown in FIG. 7D and FIG. 4, an ashing process is performed on the inner wall of the holes, which are formed in the substrates 10 and 11 (step S103). The manufacturing apparatus preferably includes a plasma device that performs the ashing process on the surface of the inner wall of the via formation holes 24. The ashing process is performed according to the following procedure. First, the substrates 10 and 11 in which the via formation holes 24 are formed are held in the plasma device. As shown in FIG. 7D, in the plasma device, the substrates 10 and 11 are arranged in a plasma gas kept at a predetermined pressure and the substrate 10 and the substrate 11 are exposed to the plasma. The plasma gas in which the plasma discharge occurs acts on the surface of the inner wall of the via formation holes 24. Ashing is performed mainly on a part of the resin 41 contained in the substrates 10 and 11 and then the resin 41 is scattered. Accordingly, the filler space 51 shown in FIG. 2 appears and a part of the resin 41 remains as the neck resin 41a, which connects the fillers. As shown in FIG. 7D, the part corresponding to a predetermined depth from the surface of the inner wall of the via formation hole 24 serves as the porous layer 15a and a porous layer 16a that contain the filler space 51 and the neck resin 41a shown in FIG. 2.

Figure 7E:
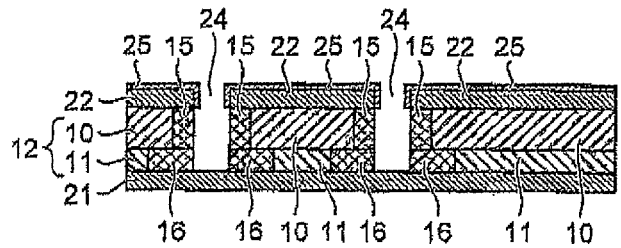
FIG. 7E is an illustrative diagram illustrating the example of the method of manufacturing a wiring board according to the embodiment.

As shown in FIG. 7E and FIG. 4, electroless plating is performed on the inner wall of the holes, which are formed in the substrates 10 and 11 (step S104). The manufacturing apparatus forms the conductive layer 35 shown in FIG. 2 on the surface of the inner wall of the via formation holes 24 by electroless plating. As shown in FIG. 7E and FIG. 2, the plating solution flows into the filler space 51 in the porous layer 15a and the porous layer 16a, so that the filler space 51 is filled with the conductive layer 35. It is not necessary to fill the whole filler space 51 with the conductive layer 35. A part of the filler space 51 may be a gap. As shown in FIG. 2, because the surface of the filler 31 is also soaked with the plating solution, the conductive layer 35 also adheres to the surface of the filler 31. Accordingly, the porous layer 15a and the porous layer 16a serve as the mix layer 15 and the mix layer 16.

The porous layer 16a, which is formed in the substrate 11 having the larger percentage content of the fillers is thicker than the porous layer 15a. In other words, the thickness of the porous layer in the substrate having a larger percentage content of the fillers increases as a result of the plasma processing. Thus, the area in which the electroless plating solution that flows into the porous layer increases, so that the thicker conductive layer 35 is formed in the porous layer. This allows more stable conduction in the mix area. In a via having a high aspect ratio, the adherence area on the inner wall of the via formation hole decreases toward the bottom of the via formation hole. By using the laminated substrate in which the substrates each containing the fillers are superposed in the thickness direction of the substrates and in which the percentage content of the fillers is different for each of the superposed substrates, the adherence of the electroless plating can be increased even if the adherence area on the inner wall of the via formation hole decreases. As a result, by arranging a substrate including a thick mix area on the bottom of the via formation hole, a via having a more larger aspect ratio can be formed.

As illustrate in FIG. 7E, the intermediate metal layer 25 is formed on the second interconnect layer 22 simultaneously when the metal film is formed on the surface of the inner wall of the via formation holes 24 by electroless plating. Thus, in the second embodiment, the intermediate metal layer 25 is made of the same material as that of the conductive layer 35. If the adherence is valued, the intermediate metal layer 25 may be made of a material different from that of the conductive layer 35 by performing sputtering. During electroless plating, it is possible not to provide the intermediate metal layer 25 on the second interconnect layer 22 by previously covering the second interconnect layer 22 with, for example, a resist.

Figure 7F:
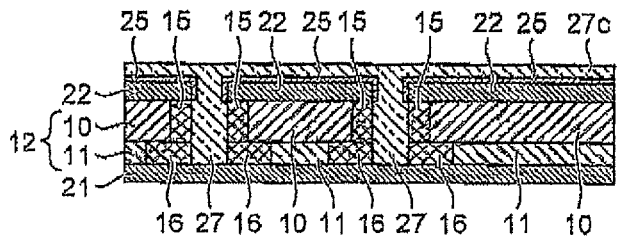
FIG. 7F is an illustrative diagram illustrating the example of the method of manufacturing a wiring board according to the embodiment.

Thereafter, as shown in FIG. 7F and FIG. 4, the holes that are formed in the substrates 10 and 11 are filled with a conductive material (step S105). As shown in FIG. 7F, the manufacturing apparatus grows the metal film by electroplating to form the filled vias 27. The conductive material that serves as the filled via 27 may be the same type of metal with which electroless plating is performed on the inner wall of the holes at step S104 or a different type of metal. The filled via 27 made of the conductive material is formed by filling in the via formation holes 24 so as to cover the whole surface of the substrate 10 on the side of the second interconnect layer 22. The metal film that is formed on the surface of the intermediate metal layer 25 by the above-described electroplating serves as the third interconnect layer 27c. It is preferable that annealing is then performed by using a heating process. This reduces detachment of the mix layers 15 and 16 by an external force.

The manufacturing apparatus then provides a certain resist on the surface of the third interconnect layer 27c. After exposing the resist and developing the resist, the manufacturing apparatus performs an etching process on a part of the third interconnect layer 27c, thereby forming an interconnect pattern. When the third interconnect portion 27a and the land 27b are formed, the second interconnect layer 22, the intermediate metal layer 25, and the third interconnect layer 27c are etched according to a predetermined interconnect pattern, so that the above-descried wiring board 3 is obtained.

The method of manufacturing a wiring board according to the second embodiment includes a step of preparing the substrate 10 and the substrate 11, which include the resin containing the fillers, and in which the first interconnect layer 21 is arranged on one surface of the substrate 11, the substrate 10 is superposed with one surface on the other surface of the substrate 11, and the second interconnect layer 22 is arranged on the other surface of the substrate 10; a step of forming the via formation hole 24 that penetrates the second interconnect layer 22, the substrate 10, and the substrate 11 and extends to the first interconnect layer 21; a step of performing the plasma processing on at least the inner wall of the via formation hole 24; and a step of performing electroless plating using the metal that serves as the conductive layer 35 on the via formation hole 24. The resin 41 containing the fillers 31 and 32 is processed by performing the plasma processing so that it becomes the porous layer 15a and the porous layer 16a and electroless plating is then performed on the porous layer 15a and the porous layer 16a. As a result, the wiring board 3, which is manufactured by the method of manufacturing a wiring board according to the second embodiment, allows electrical interlayer connection and a low-resistance interconnect can be formed. When the filled via 27 is formed by electroplating, the mix area functions as an electron carrier during the electroplating, which reduces defects of the filled via. As a result, the method of manufacturing a wiring board according to the second embodiment can achieve stable interlayer connection. Thus, the wiring board 3 with a low risk of malfunction and high reliability can be manufactured. In a method of manufacturing a wiring board of a modification, the second interconnect layer may be omitted in the process of preparing a substrate (step S101) and an interconnect pattern can be formed on the top (the portion corresponding to the second interconnect layer 22) simultaneously at the following step (step S105) of filling the holes formed in the substrate 10 with the conductive material.

In the method of manufacturing a wiring board according to the second embodiment, when the filled via 27 is formed by electroplating, the mix area A functions as an electron carrier during the electroplating, which reduces defects of the filled via. As a result, a reliable interlayer connection can be achieved; therefore, the wiring board 3 manufactured by the method of manufacturing a wiring board according to the second embodiment has a low risk of malfunction and is highly reliable.

In the second embodiment, the substrate 10, which serves as a first substrate including a resin containing a plurality of fillers, and the substrate 11, which serves as a second substrate including a resin containing a larger percentage content of the fillers than that of the first substrate 10, are superposed in the thickness direction of the substrates, so that the laminated substrate is formed. The second substrate 11 is arranged, relative to the first substrate 10, on the side of the first interconnect layer 21. If the percentage content of the fillers is high, the thickness of the porous layer increases as a result of the plasma processing. Thus, the area in which the porous layer is impregnated with the electroless plating solution increases, which allows more stable conduction. By arranging the substrate with the thick mix area on the bottom of the via formation hole, it is possible to form a via having a higher aspect ratio.

In the via having a high aspect ratio, the adherence area on the inner wall of the via formation hole decreases toward the bottom of the via formation hole. By using the laminated substrate in which the substrates each containing the fillers are superposed in the thickness direction of the substrates and in which the percentage content of the fillers is different for each of the superposed substrates, the adherence of the electroless plating can be increased even if the adherence area on the inner wall of the via formation hole decreases. If a laminated substrate is used in which three or more substrates each containing a plurality of fillers are superposed and in which the percentage content of the fillers is different for each of the superposed substrates such that the percentage content of the fillers increases toward the bottom of a via formation hole, the reliability can be maintained even if the aspect ratio is further increased.

In the second embodiment, it is described that the substrate 10 includes the resin containing the fillers and, if the resin of the substrate 10 is, for example, epoxy resin and the fillers are silicon dioxide ($SiO_2$), the percentage content of the fillers is between 50% and 76% by volume (between 70% and 85% by mass) relative to the resin. In a modification of the second embodiment, if the resin of the substrate 10 is epoxy resin and the fillers is silicon dioxide ($SiO_2$), the percentage content of the fillers may be between 0% and 55% by volume (between 0% and 69% by mass) relative to the resin. In other words, as long as the above-described mix layer containing the mix area is formed in the second substrate 11, even if no mix layer containing a mix area is formed in the first substrate 10, a highly-reliable via is formed even if the via hole has a large aspect ratio. As in the case of the first embodiment, the filled via 27 shown in FIG. 7F may be formed by only electroless plating.

In the wiring board and the method of forming a wiring board according to the second embodiment, the laminated substrate is used in which the substrates each containing the fillers are superposed in the thickness direction of the substrates and in which the percentage content of the fillers is different for each of the superposed substrates. Thus, there is a trend that the inner diameter of the via formation hole on the opening side in the mix layer of the substrate containing the larger percentage content of the fillers is larger than the inner diameter of the via formation hole on the opening side in the mix layer of the substrate containing the lower percentage content of the fillers. The reason of this is that the reaction speed of the resin during the ashing process varies depending on the percentage content of the fillers relative to the resin. For this reason, by adjusting the percentage content of the fillers, it is possible to control the inner diameter of the via formation hole on the opening side in the substrates each containing the fillers and having a different percentage content of the fillers.

In the wiring board of the modification, for the substrate that includes the resin containing the fillers, a laminated substrate is used in which the substrates each containing the fillers are superposed and in which the percentage content of the fillers is different for each of the superposed substrates. Furthermore, the substrate having the larger percentage content of the fillers is arranged on the opening side of the via formation hole in which the via is formed. In the substrate having the larger percentage content of the fillers, the inner diameter of the via formation hole on the opening side can be increased. In addition, the inner diameter of the via formation hole on the opening side can be reduced toward the substrate having the lower percentage content of the fillers.

Third Embodiment

Figure 8:
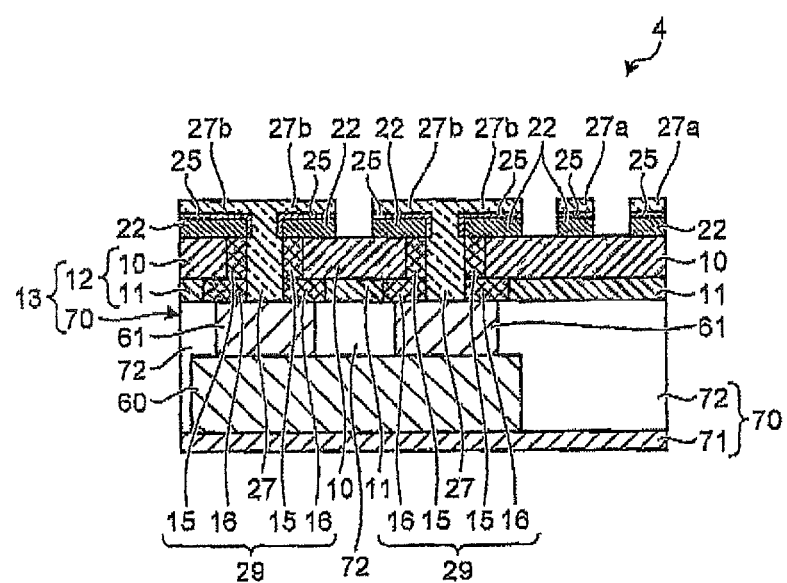
FIG. 8 is a cross-sectional view illustrating the wiring board according to an embodiment.

FIG. 8 is a cross-sectional view illustrating a wiring board according to the third embodiment. The wiring board and the method of manufacturing a wiring board according to the third embodiment is characterized by the fact that the above-described laminated substrate, in which the substrates each containing the fillers are superposed in the thickness direction of the substrates and in which the percentage content of the fillers is different for each of the superposed substrates, is superposed on a substrate that includes a terminal electrode. In the following descriptions, the same elements as those of the first and second embodiments are denoted by the same reference numerals as those of the first and second embodiments and redundant descriptions will be omitted.

As shown in FIG. 8, a wiring board (wiring circuit board) 4 includes a laminated substrate 13, the second interconnect layer 22, the third interconnect portion 27a, the via 29, the land 27b, the intermediate metal layer 25, an electronic component 60, and a terminal electrode 61. The laminated substrate 13 includes the laminated substrate 12 including the substrate 10 and the substrate 11; and a laminated substrate 70 including a substrate 71 and a substrate 72. The via 29 includes the filled via 27, the mix layer 15, and the mix layer 16. The laminated substrate 13 includes the electronic component 60 and the terminal electrode 61. Accordingly, the laminated substrate 13 serves as an electronic component embedded substrate.

The laminated substrate 70 is a laminated substrate in which the substrate 71 and the substrate 72 are superposed in their thickness direction. The substrates 71 and 72 are plate-like members and, like the substrate 10, are formed from an insulating material, such as, a resin. For the substrates 71 and 72, only an insulating material may be used or a composite material obtained by mixing a filler into the insulating material may be used.

The laminated substrate 70 includes the electronic component 60 mounted on the substrate 71. The electronic component 60 is sealed with the material of the substrate 72. The electronic component 60 includes, for example, a resistor, a capacitor, a coil, and an integrated circuit. The electronic component 60 includes the input/output terminal electrode 61.

The terminal electrode 61 is formed from a conductive material, such as a metal. For the terminal electrode 61, for example, copper (Cu), silver (Ag), nickel (Ni), cobalt (Co), tin (Sn), rhodium (Rh), palladium (Pd), gold (Au), aluminum (Al) or an alloy of the above-described metals can be used. Furthermore, a laminated structure selected from the above-described alloys of nickel (Ni), gold (Au), etc. may be provided by electroless plating on an aluminum electrode of the electronic component 60.

In the wiring board 4 according to the third embodiment, the laminated substrate, in which the substrates each containing the fillers are superposed in the thickness direction and in which the percentage content of the fillers is different for each of the superposed substrates, serves as a substrate that includes a resin containing a plurality of fillers. Furthermore, the substrate 11 having the larger percentage content of the fillers is arranged on the side of the bottom of a via formation hole in which a via is formed.

An increase in the percentage content of the fillers increases the thickness of the mix area. For this reason, by arranging the substrate 11 having a large thickness of the mix area in the radial direction of the via on the bottom of the via formation hole, a via having a larger aspect ratio can be formed. If the thickness of the mix area in the radial direction of the via is large, a plating solution flows into the filler space 51 between the fillers, which allows the plating to be easily fixed to the mix area. A conductive layer that functions as an electron carrier is formed stably on the bottom of the via formation hole. As a result, in the wiring board 4 according to the second embodiment, by forming the mix layer 16 near the bottom of the via formation hole when the via is formed, defects of the filled via 27 can be reduced even if the aspect ratio is high.

In the wiring board 4, because the first interconnect layer 21 and the terminal electrode 61 can be electrically connected to each other by the via 29 that includes the filled via 27, the mix layer 15, and the mix layer 16, the connection resistance between the second interconnect layer 22 and the terminal electrode 61 decreases. Thus, a lower-resistance interconnect can be obtained. Furthermore, there is the conductive layer 35 that extends from the surface of the second interconnect layer 22 to the surface of the terminal electrode 61 (i.e., from one surface on the substrate 10 to the other surface on the substrate 11). Thus, when the filled via 27 is formed by electroplating, the conductive layer 35 can reduce defects, such as voids or seams, of the filled via 27. Accordingly, interlayer connection can be stable, which reduces a risk of failure in the interconnect.

The wiring board 4 is an electronic component embedded substrate. The wiring board 4 includes the substrates 10 and 11 including the resin containing the fillers and the via 29. The via 29 is electrically connected to at least one second interconnect layer 22 provided on the laminated substrate 13. The via 29 includes a mix area in which metal is provided between the fillers on the inner radial side with respect to the substrates 10 and 11. The via 29 is electrically connected to the electronic component 60 in the resin. This allows low-resistance connection to the electronic component 60.

The wiring board 4 includes the filled via 27, i.e., has a filled via structure. However, the third embodiment is not limited to the filled via structure. A conformal via structure without the filled via 27 may be used so that the first interconnect layer 21 and the terminal electrode 61 are electrically connected to each other via only the mix layer 15 and the mix layer 16. The method of manufacturing a wiring board according to the third embodiment will be described.

FIGS. 9A to 9F are illustrative diagrams illustrating an example of the method of manufacturing a wiring board according to the third embodiment. The method of manufacturing a wiring board according to the third embodiment will be described with reference to FIGS. 9A to 9F and FIG. 4.

Figure 9A:
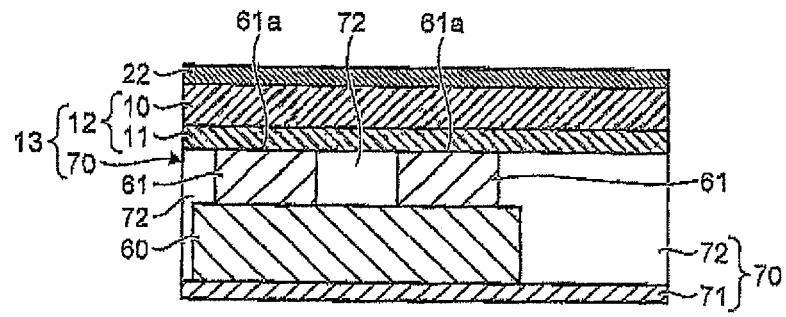
FIG. 9A is an illustrative diagram illustrating an example of a method of manufacturing a wiring board according to the embodiment.

As shown in FIG. 9A and FIG. 4, first, the laminated substrate 12, in which the substrate 10 is superposed on the substrate 11, and the laminated substrate 70, which includes the terminal electrode 61, are superposed and prepared (step S101). The substrate 11 is arranged such that its one surface is opposed to the laminated substrate 70 and makes contact with a surface 61a of the terminal electrode 61. The substrate 10 is superposed with its one surface on the other surface of the substrate 11. A metal film (metal foil) is arranged on the other surface of the substrate 10, so that the second interconnect layer 22 is formed.

Figure 9B:
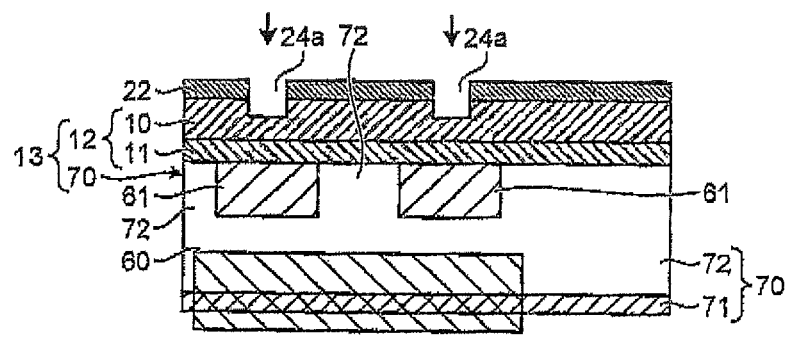
FIG. 9B is an illustrative diagram illustrating the example of the method of manufacturing a wiring board according to the embodiment.
Figure 9C:
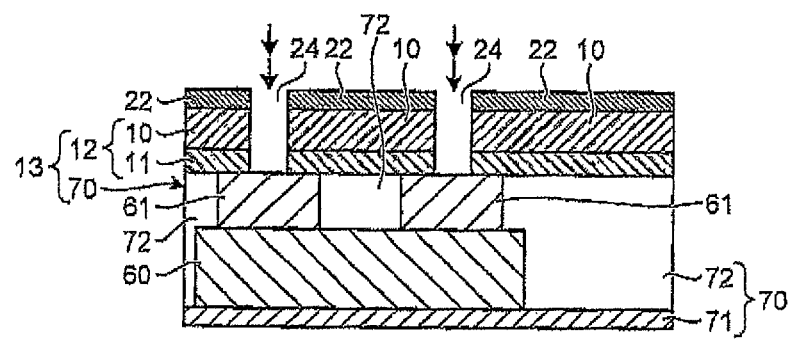
FIG. 9C is an illustrative diagram illustrating the example of the method of manufacturing a wiring board according to the embodiment.

As shown in FIG. 9B, FIG. 9C, and FIG. 4, holes for forming vias in the laminated substrate 12 are formed (step S102). A manufacturing apparatus irradiates predetermined positions from the side of the second interconnect layer 22 of the substrate 10 shown in FIG. 9B with a UV-YAG laser or a direct $CO_2$ laser, thereby forming the via formation holes 24a. The via formation holes 24a penetrate the second interconnect layer 22 and extend to a part of the substrate 10.

The manufacturing apparatus then further deepens the formed via formation holes 24a by using, for example, a $CO_2$ laser or a UV-YAG laser, so that, as illustrated in FIG. 9C, the via formation holes 24a reach the terminal electrode 61 and the via formation holes 24 are formed.

Figure 9D:
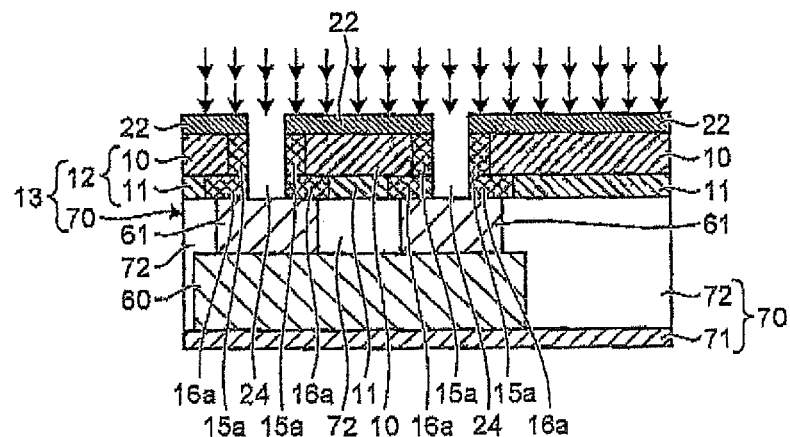
FIG. 9D is an illustrative diagram illustrating the example of the method of manufacturing a wiring board according to the embodiment.

As shown in FIG. 9D and FIG. 4, an ashing process is performed on the inner wall of the holes, which are formed in the substrates 10 and 11 (step S103). The manufacturing apparatus preferably includes a plasma device that performs the ashing process on the surface of the inner wall of the via formation holes 24. The ashing process is performed according to the following procedure. First, the substrates 10 and 11 in which the via formation holes 24 are formed are held in the plasma device. As shown in FIG. 9D, in the plasma device, the substrates 10 and 11 are arranged in a plasma gas kept at a predetermined pressure and the substrate 10 and the substrate 11 are exposed to the plasma. The plasma gas in which the plasma discharge occurs acts on the surface of the inner wall of the via formation holes 24. Ashing is performed mainly on a part of the resin 41 contained in the substrate 10 and the substrate 11 and then the resin 41 is scattered. Accordingly, the filler space 51 shown in FIG. 2 appears and a part of the resin 41 remains as the neck resin 41a, which connects the fillers. As shown in FIG. 9D, the part corresponding to a predetermined depth from the surface of the inner wall of the via formation hole 24 serves as the porous layer 15a and the porous layer 16a that contain the filler space 51 and the neck resin 41a shown in FIG. 2.

Figure 9E:
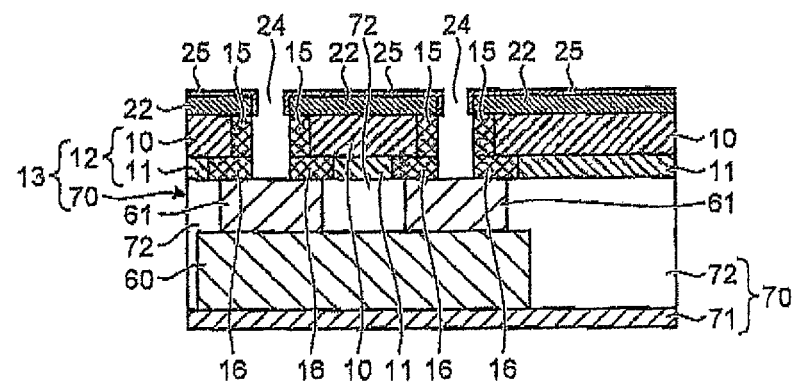
FIG. 9E is an illustrative diagram illustrating the example of the method of manufacturing a wiring board according to the embodiment.

As shown in FIG. 9E and FIG. 4, electroless plating is performed on the inner wall of the holes, which are formed in the substrates 10 and 11 (step S104). The manufacturing apparatus forms the conductive layer 35 shown in FIG. 2 on the surface of the inner wall of the via formation holes 24 by electroless plating. As shown in FIG. 9E and FIG. 2, the plating solution flows into the filler space 51 in the porous layer 15a and the porous layer 16a, so that the filler space 51 is filled with the conductive layer 35. It is not necessary to fill the whole filler space 51 with the conductive layer 35. A part of the filler space 51 may be a gap. As shown in FIG. 2, because the surface of the filler 31 is also soaked with the plating solution, the conductive layer 35 also adheres to the surface of the filler 31. Accordingly, the porous layer 15a and the porous layer 16a serve as the mix layer 15 and the mix layer 16.

The porous layer 16a, which is formed in the substrate 11 having the larger percentage content of the fillers, is thicker than the porous layer 15a. In other words, the thickness of the porous layer in the substrate having a larger percentage content of the fillers increases as a result of the plasma processing. Thus, the area in which the electroless plating solution that flows into the porous layer increases, so that the thicker conductive layer 35 is formed in the porous layer. This allows more stable conduction in the mix area. In a via having a high aspect ratio, the adherence area on the inner wall of the via formation hole decreases toward the bottom of the via formation hole. By using the laminated substrate in which the substrates each containing the fillers are superposed in the thickness direction of the substrates and in which the percentage content of the fillers is different for each of the superposed substrates, the adherence of the electroless plating can be increased even if the adherence area on the inner wall of the via formation hole decreases. As a result, by arranging a substrate including a thick mix area on the bottom of the via formation hole, a via having a more larger aspect ratio can be formed.

As illustrated in FIG. 7E, the intermediate metal layer 25 is formed on the second interconnect layer 22 simultaneously when the metal film is formed on the surface of the inner wall of the via formation holes 24 by electroless plating. Thus, in the second embodiment, the intermediate metal layer 25 is made of the same material as that of the conductive layer 35. If the adherence is valued, the intermediate metal layer 25 may be made of a material different from that of the conductive layer 35 and by performing sputtering. During electroless plating, it is possible not to provide the intermediate metal layer 25 on the second interconnect layer 22 by previously covering the second interconnect layer 22 with, for example, a resist.

Figure 9F:
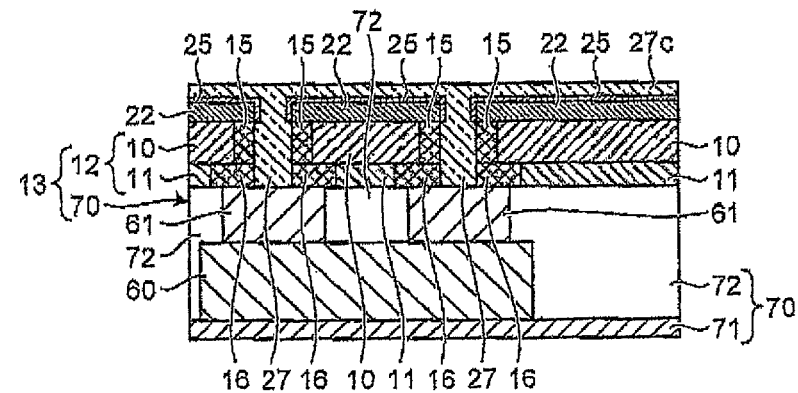
FIG. 9F is an illustrative diagram illustrating the example of the method of manufacturing a wiring board according to the embodiment.

Thereafter, as shown in FIG. 9F and FIG. 4, the holes that are formed in the substrates 10 and 11 are filled with a conductive material (step S105). As shown in FIG. 9F, the manufacturing apparatus grows the metal film by electroplating to form the filled vias 27. The conductive material that serves as the filled via 27 may be the same type of metal with which electroless plating is performed on the inner wall of the holes at step S104 or a different type of metal. The filled via 27 made of a conductive material is formed by filling in the via formation holes 24 so as to cover the whole surface of the substrate 10 on the side of the second interconnect layer 22. The metal film that is formed on the surface of the intermediate metal layer 25 by the above-described electroplating serves as the third interconnect layer 27c. It is preferable that annealing is then performed by using a heating process. This reduces detachment of the mix layers 15 and 16 by an external force.

The manufacturing apparatus then provides a certain resist on the surface of the third interconnect layer 27c. After exposing the resist and develops the resist, the manufacturing apparatus performs an etching process on a part of the third interconnect layer 27c, thereby forming an interconnect pattern. When the third interconnect portion 27a and the land 27b are formed, the second interconnect layer 22, the intermediate metal layer 25, and the third interconnect layer 27c are etched according to a predetermined interconnect pattern, so that the above-descried wiring board 4 is obtained.

The method of manufacturing a wiring board according to the third embodiment includes a step of preparing the substrate 10 and the substrate 11, which include the resin containing the fillers, and in which the terminal electrode 61 is arranged on one surface of the substrate 11, in which the substrate 10 is superposed with one surface on the other surface of the substrate 11, and in which the second interconnect layer 22 is arranged on the other surface of the substrate 10; a step of forming the via formation hole 24 that penetrates the second interconnect layer 22 and the substrates 10, and the substrate 11 and that extends to the terminal electrode 61; a step of performing the plasma processing on at least the inner wall of the via formation hole 24; and a step of performing electroless plating using the metal that serves as the conductive layer 35 on the via formation hole 24. The resin 41 containing the fillers 31 and 32 is processed by performing the plasma processing so that it becomes the porous layer 15a and the porous layer 16a and electroless plating is then performed on the porous layer 15a and the porous layer 16a. As a result, the wiring board 4, which is manufactured by the method of manufacturing a wiring board according to the third embodiment, allows electrical interlayer connection and a low-resistance interconnect can be obtained. If the filled via 27 is formed by electroplating, the mix area functions as an electron carrier during the electroplating, which reduces defects of the filled via. As a result, the method of manufacturing a wiring board according to the third embodiment can achieve stable interlayer connection. Thus, the wiring board 4 with a low risk of malfunction and high reliability can be manufactured.

The wiring board 4 according to the third embodiment uses the laminated substrate 12. As another modification, the above-described wiring board 4 may be formed by using the substrate 10 and the substrates 10 that have the same percentage content of the fillers, i.e., by using a single layer. Like the substrate 10 and the substrate 11, the substrate 72 may be formed from a resin containing a plurality of fillers. The substrate 72 may have a higher percentage content of the fillers than that of the substrate 11.

Figure 10A:
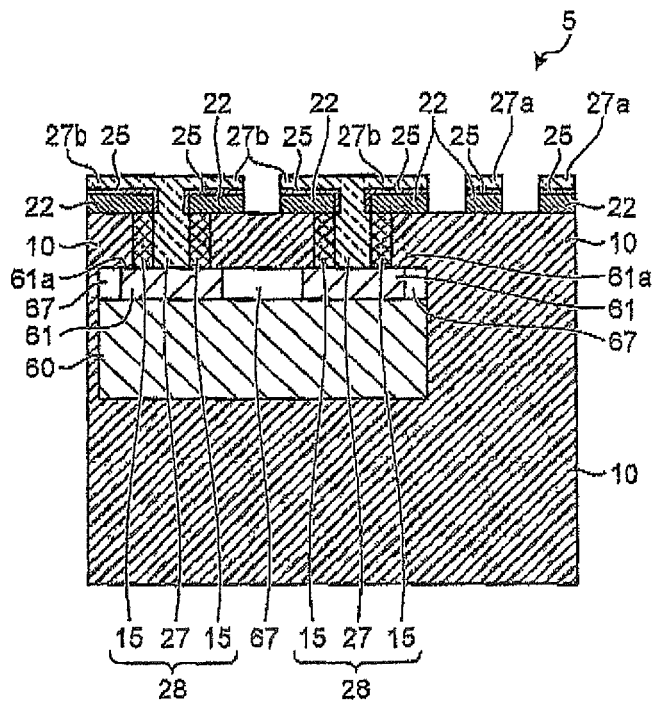
FIG. 10A is a cross-sectional view illustrating a modification of the wiring board according to the embodiment.

FIG. 10A is a cross-sectional view illustrating a modification of the wiring board according to the third embodiment. A wiring board 5 according to the modification is characterized by the fact that the terminal electrode 61 and the electronic component 60 shown in FIG. 8 are arranged in the substrate 10. As for the electronic component 60, usually, a protective layer 67, which is referred to as a passivation, protects the periphery of the terminal electrode 61. Accordingly, a possibility of erosion etc. of the terminal electrode 61 can be reduced. In order to embed the electronic component 60 in the substrate 10, it is necessary to connect the filled via 27 and the terminal electrode 61.

It is preferable that the electronic component 60 be embedded in the substrate 10 by grounding the surface of the electronic component 60 such that the surface 61a of the terminal electrode 61 is exposed. Alternatively, even if the surface 61a of the terminal electrode 61 is covered with the protective layer 67, the electronic component 60 can be embedded in the substrate 10 by causing the surface 61a of the terminal electrode 61 to be exposed by etching, such as milling.

In the wiring board 5 according to the modification, because the electronic component 60 is embedded in the substrate 10 and the space for mounting the electronic component 60 can be reduced, the circuit board can be highly-dense. In the wiring board 5 of the modification, the laminated substrate 12 may be used instead of the substrate 10. In the modification, the terminal electrode is embedded in the substrate 10. However, as long as the surface 61a of the terminal electrode 61 is embedded in the substrate 10, other parts may be arranged outside the substrate 10.

The wiring board 5 according to the modification is an electronic component embedded substrate in which the filled via 27 and the conductive layer 35 of the mix layer 15 together serve as the via 28, which can electrically connects the terminal electrode 61 and the second interconnect layer 22. Even if there is only the mix area A, the terminal electrode 61 and the second interconnect layer 22 can be electrically connected to each other. As a result, even if the via has a high aspect ratio and thus the adherence area B of the mix layer 15 is small on the surface 61a of the terminal electrode 61, i.e., near the bottom of the via formation hole, electrical interlayer connection is allowed and a low-resistance interconnect can be obtained. Accordingly, in the wiring board 5, the filled via 27 and the terminal electrode 61 are connected with a low resistance to each other.

Figure 10B:
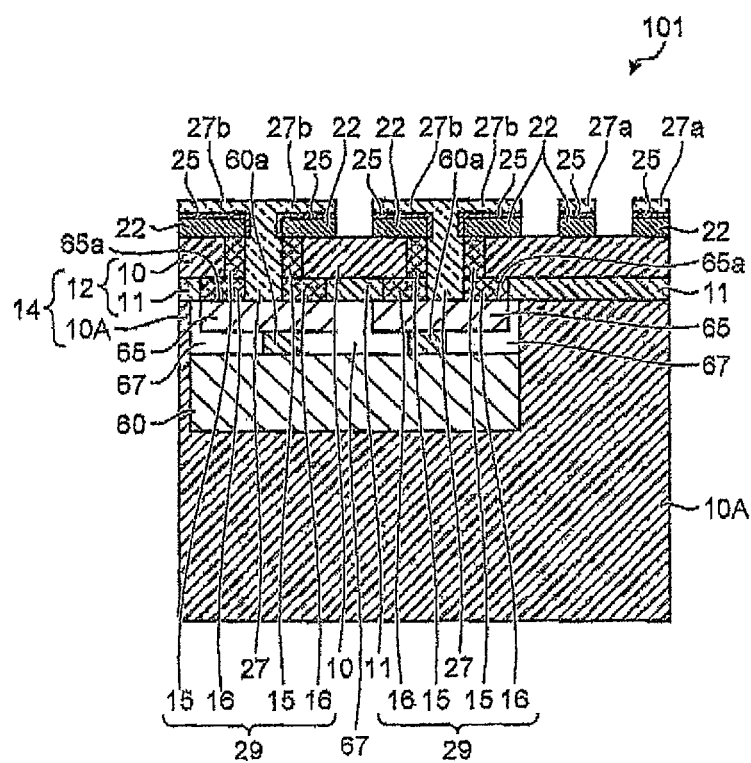
FIG. 10B is a cross-sectional view illustrating a modification of the wiring board according to the embodiment.

FIG. 10B is a cross-sectional view illustrating another modification of the wiring board according to the third embodiment. In the above-described wiring board 5, the terminal electrode 61 and the electronic component 60 are arranged in the substrate 10. A wiring board 101 according to the present modification is characterized by the fact that the electronic component 60 is connected not to the terminal electrode 61 but to a redistribution layer 65. As shown in FIG. 10B, the wiring board 101 includes a laminated substrate 14, the second interconnect layer 22, the third interconnect portion 27a, the via 29, the land 27b, the intermediate metal layer 25, the electronic component 60, the redistribution layer 65, and the protective layer 67. The laminated substrate 14 includes the laminated substrate 12, which includes the substrate 10 and the substrate 11, and a substrate 10A. The substrate 10A is made of the same material as that of the substrate 10. The same material as that of the substrate 10 may be used for the substrate 11 and a single material may be used for the laminated substrate 14. The via 29 includes the filled via 27, the mix layer 15, and the mix layer 16. The substrate 10A contains the electronic component 60 and the redistribution layer 65. Accordingly, the laminated substrate 14 serves as an electronic component embedded substrate.

In the electronic component 60, usually, the protective layer 67, which is referred to as a passivation, protects the periphery of the electrode of the electronic component 60. Accordingly, while a possibility of erosion etc. of the terminal electrode can be reduced, the electrode is connected to external components outside the electronic component 60 via the redistribution layer 65. The redistribution layer 65 is formed from, for example, copper (Cu) and the position of connection with the filled via 27 can be changed. Alternatively, for the redistribution layer 65, for example, silver (Ag), nickel (Ni), cobalt (Co), tin (Sn), rhodium (Rh), palladium (Pd), gold (Au), aluminum (Al) or an alloy of the above-described metals can be used. A laminated structure selected from the above-described alloys may be provided on the aluminum (Al) electrode of the electronic component 60 by electroless plating.

In the present modification, one surface of the substrate 11 and the redistribution layer 65 are adjacent and connected to each other. Furthermore, the filled via 27 and the redistribution layer 65 are connected to each other. In this case, like the substrate 10, the substrate 10A is formed from a resin containing a plurality of fillers. Alternatively, an insulating material that contains no filler may be used.

In the wiring board 101 according to the present modification, the filled via 27 and the conductive layer 35 of the mix layers 15 and 16 together serve as the via 29, which can electrically connects the redistribution layer 65 and the second interconnect layer 22. Even if there is only the mix area A, the redistribution layer 65 and the second interconnect layer 22 can be electrically connected to each other. As a result, even if the via has a high aspect ratio and thus the adherence area B of the mix layer 16 is small on a surface 65a of the redistribution layer 65, i.e., near the bottom of the via formation hole, electrical interlayer connection is allowed and a low-resistance interconnect can be obtained. Accordingly, in the wiring board 101, the filled via 27 and the redistribution layer 65 can be connected with a low resistance to each other.

Figure 10C:
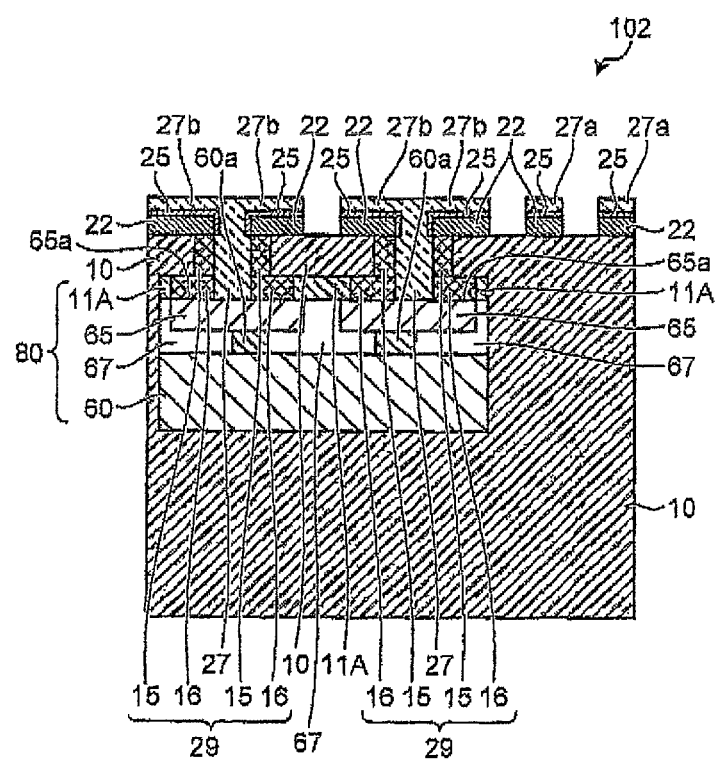
FIG. 10C is a cross-sectional view illustrating a modification of the wiring board according to the embodiment.

FIG. 10C is a cross-sectional view illustrating another modification of the wiring board according to the third embodiment. A wiring board 102 according to the present modification is characterized by the fact that a resin layer that contains the same fillers as those of the substrate 11 shown in FIG. 10B is previously formed on the electronic component 60 and embedded as a resin layer 11A in the substrate 10.

A resin-formed electronic component 80 includes the electronic component 60, an electrode 60a of the electronic component 60, the redistribution layer 65, the protective layer 67, and the resin layer 11A. Accordingly, in addition to the thickness of the redistribution layer 65 and the protective layer 67, the thickness of the resin layer 11A can be added. As a result, even if the electronic component 60 is thin and thus easily deforms, the thickness of the redistribution layer 65 and the protective layer 67 and the thickness of the resin layer 11A prevent a chip due to chipping when a wafer is diced or a damage due to handling when the embedding in the substrate 10 is performed. In the wiring board 102 according to the present modification, the resin-formed electronic component 80 is embedded in the substrate 10. The substrate 10 serves as an electronic component embedded substrate.

The wiring board 102 according to the present modification is an electronic component embedded substrate. The filled via 27 and the conductive layer 35 of the mix layers 15 and 16 together serve as the via 29, which can electrically connects the redistribution layer 65 and the second interconnect layer 22. Even if there is only the mix area A, the redistribution layer 65 and the second interconnect layer 22 can be electrically connected to each other. As a result, even if the via has a high aspect ratio and thus the adherence area B of the mix layer 16 is small on the surface 65a of the redistribution layer 65, i.e., near the bottom of the via formation hole, electrical interlayer connection is allowed and a low-resistance interconnect can be obtained. Accordingly, in the wiring board 102, the filled via 27 and the redistribution layer 65 can be connected with a low resistance to each other. In the wiring board 102 according to the present modification, the resin layer 11A may contain the same percentage content the fillers as that of the substrate 10. In the modification, the redistribution layer 65 is embedded and arranged in the substrate 10. However, as long as the surface 65a of the redistribution layer 65 is embedded in the substrate 10, other parts may be arranged outside the substrate 10.

A method of manufacturing the wiring board 102 according to the present modification (method of manufacturing an electronic component embedded substrate) includes a step of superposing the resin layer 11A that includes the resin containing the fillers on the electronic component 60; a step of forming the via formation holes in the resin layer 11A, a step of performing an ashing process on at least the inner wall of the via formation holes, and a step of performing electroless plating on the inner wall of the via formation holes. This prevents a chip due to chipping when a wafer is diced or a damage due to handling when the embedding in the substrate 10 is performed. Furthermore, because the mix area can be formed near the electronic component 60 to be connected, the resin in which the electronic component is embedded can be changed.

Fourth Embodiment

Figure 11A:
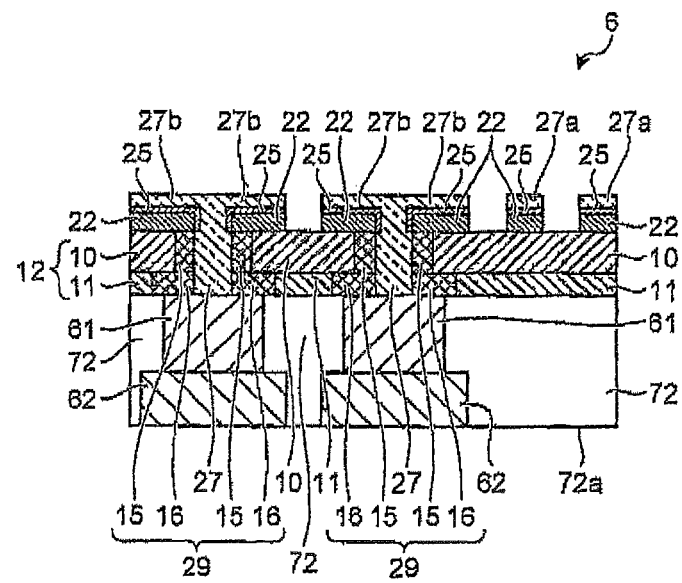
FIG. 11A is a cross-sectional view illustrating a wiring board according to an embodiment.

FIG. 11A is a cross-sectional view illustrating a wiring board according to a fourth embodiment. In the third embodiment, a case is described in which the electronic component 60 is included. A wiring board according to the fourth embodiment is characterized by the fact that, instead of the electronic component 60 included in the substrate 72, terminal electrodes serving as a conductive post are included. The substrate 72 of a wiring board 6 includes the terminal electrode 61 and a terminal electrode 62 as the terminal electrodes that serve as a conductive post. The terminal electrode 62 has a larger volume than that of the terminal electrode 61. A conduction post is formed such that the terminal electrode 61 protrudes from the terminal electrode 62. The terminal electrode 61 is formed from the same material as that of the above-described terminal electrode 61. One end of the terminal electrode 62 is electrically connected to the terminal electrode 61 and the other end of the terminal electrode 62 is exposed. Accordingly, in the wiring board 6, the filled via 27 and the terminal electrode 62 are connected with a low resistance to each other.

Figure 11B:
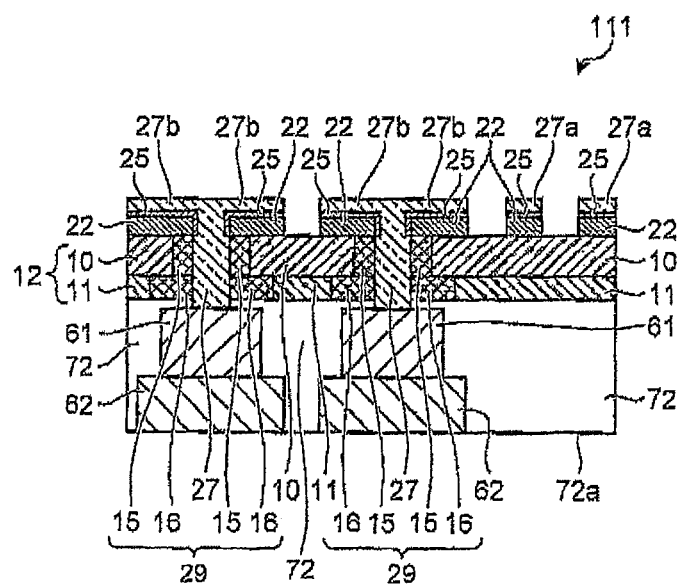
FIG. 11B is a cross-sectional view illustrating a modification of the wiring board according to the embodiment.

FIG. 11B is a cross-sectional view illustrating a modification of the wiring board according to the fourth embodiment. In the wiring board 6 described above, the terminal electrode 61 is adjacent to and arranged on one surface of the substrate 11 and the filled via 27 and the terminal electrode 61 are connected. In a wiring board 111 according to the present modification, the terminal electrode 61 is adjacent to and arranged on the side of one surface of the substrate 11 but the terminal electrode 61 is confined within an insulating material of the substrate 72. The terminal electrode 61 is arranged on one surface of the substrate 11 via the insulating material of the substrate 72. The filled via 27 extends from the substrate 11 to the inside of the substrate 72 and thus the filled via 27 and the terminal electrode 61 are connected. In this case, it is preferable that the substrate 72 be formed, like the substrate 10 and the substrate 11, from a resin that contains a plurality of fillers because a mix layer is formed also around the part where the filled via 27 extends to the inside of the substrate 72. It is more preferable that the substrate 72 have a larger percentage content of the fillers than that of the substrate 11, which increases the area in which the porous layer is impregnated with the electroless plating solution, which allows more stable conduction.

Figure 11C:
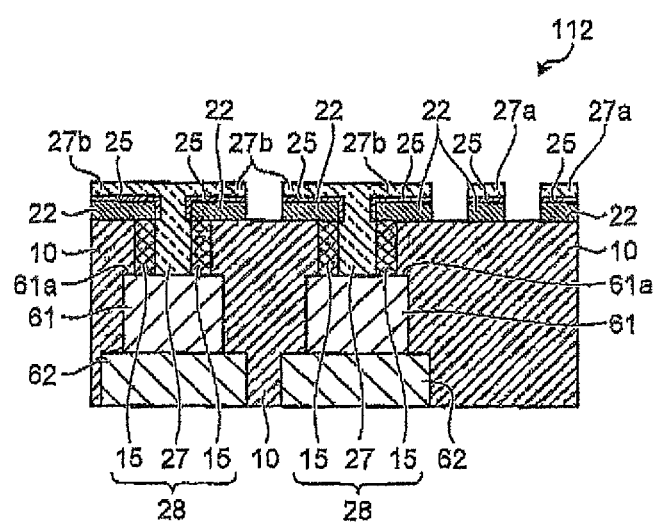
FIG. 11C is a cross-sectional view illustrating a modification of the wiring board according to the embodiment.

FIG. 11C is a cross-sectional view illustrating another modification of the wiring board according to the fourth embodiment. A wiring board 112 according to the present modification is characterized by the fact that the terminal electrodes 61 and 62 are arranged in the substrate 10. Accordingly, even if a conductive post is embedded in the substrate 10, the conductive post and the filled via 27 can be connected with a low resistance to each other. In another modification, the electronic component 60 including the terminal electrode 61 instead of the terminal electrodes 61 and 62, which serve as a conductive post, may be arranged in the substrate 10. Accordingly, as a space for mounting the electronic component 60 can be positioned in the substrate 10, the circuit board can be highly dense. In the wiring board 112 according to the modification, the substrate 10 can be replaced with the laminated substrate 12. In the modification, the terminal electrode 61 is arranged so as to be embedded in the substrate 10. However, as long as, for example, the surface 61a of the terminal electrode 61 is embedded in the substrate 10, other parts may be arranged outside the substrate 10.

In a method of manufacturing a wiring board according to the fourth embodiment, when the filled via 27 is formed by electroplating, the mix area A functions as an electron carrier during electroplating, which reduces defects of the filled via. As a result, reliable interlayer connections can be achieved; therefore, the wiring boards 4, 5, 6, 101, 102, 111, and 112 manufactured by the method of manufacturing a wiring board according to the fourth embodiment have a low-risk of malfunction and are highly reliable. Any of the above-described wiring boards 1, 2, 3, 3, 5, 6, 101, 102, 111, and 112 can be superposed to form a combined wiring board.

Evaluation

The wiring board 1 according to the first embodiment was manufactured as an evaluation example. Specifically, for the substrate 10, a resin sheet (for example, ABF-GX13 manufactured by Ajinomoto Fine-Techno Co., Inc.) obtained by mixing an epoxy resin with a filler of silicon dioxide ($SiO_2$) was prepared. The filler of the prepared resin sheet had a particle diameter of 10 μm or less and an average particle diameter (D50) of 1.4 μm. The average particle diameter was measured by using a laser diffraction (scattering) method. The circularity of the filler was 0.7 or more. The circularity was measured according to the data obtained by using the laser diffraction (scattering) method.

The substrate 10 was formed so as to have a thickness of 50 μm. The diameter of the via formation hole 24 was φ10 μm. The first interconnect layer 21 and the second interconnect layer 22 were formed to have a thickness of 5 μm. Accordingly, the aspect ratio (via depth/via diameter) was 5.

An ashing process was performed by using a plasma processing device (model number M210 manufactured by Nisshin Inc.). The plasma processing was performed by using a microwave plasma method. For the plasma gas, a mixed gas of tetrafluoride ($CF_4$) and oxygen ($O_2$) was used. Specifically, a mixed gas of 180 $cm^3$/min (sccm) tetrafluoride ($CF_4$) and 1400 $cm^3$/min (sccm) oxygen ($O_2$) was used at a flow volume that is standardized by the manufacturer of the plasma processing device. The plasma processing device had a power input of 3 kW and a pressure of 100 MPa.

The level of the plasma condition for the plasma processing device (plasma ashing volume) is determined according to the reaction level (ashing volume) of a liquid resist, which is a standard sample. The standard sample is defined by the manufacturer of the plasma processing device. For example, the plasma reaction increases in strength according to the following conditions in the order in which they appear in this list: a plasma condition of 100 nm (1000 angstrom), a plasma condition of 250 nm (2500 angstrom), and a plasma condition of 500 nm (5000 angstrom). Samples of the substrate 10 were prepared with percentage content (by volume) of the filler of 0% by volume, 30% by volume, 50% by volume, 55% by volume, 76% by volume, and 90% by volume. The substrate samples were processed without processing (i.e., under a plasma condition of 0) and processed with processing under the plasma condition of 50 nm, the plasma condition of 100 nm, the plasma condition of 250 nm, and the plasma condition of 500 nm. The conductive layer 35 shown in FIG. 2 was then formed by electroless plating on the inner wall of the via formation hole 24 and then the state of formation of the conductive layer 35 was evaluated. The results of the evaluation are shown in the following Table 1.

TABLE 1

| | | Plasma condition | | | | |
|---|---|---|---|---|---|---|
| | | 0 | 50 nm | 100 nm | 250 nm | 500 nm |
| Filler percentage content (% by volume) | 0 | x | x | x | x | x |
| | 30 | x | x | x | Δ | Δ |
| | 50 | x | o | o | o | o |
| | 55 | x | o | o | o | o |
| | 76 | x | o | o | o | o |
| | 90 | x | o | o | o | o |

As for the evaluation standards, "o" indicates that the mix layer is entirely formed near the bottom of the via formation hole, "Δ" indicates that the mix layer is irregularly formed near the bottom of the via formation hole, and "x" indicates that no mix layer is formed near the bottom of the via formation hole.

As Table 1 shows, if the substrate contains a filler and the plasma processing is performed, a conductive layer is formed near the bottom of the via formation hole. When the percentage content of the filler was 50% by volume or more, under the plasma condition of between 50 nm and 500 nm, the conductive layer is formed stably near the bottom of the via formation hole. Furthermore, no smear (surface unevenness) was identified when the percentage content of the filler was 55% by volume or greater. Thus, if the percentage content of the filler of the substrate is 55% or greater, under the plasma condition between 50 nm and 500 nm, the conductive layer near the bottom of the via formation hole can be formed stably without taking smears into consideration. Furthermore, filler drop-off was seen depending on the percentage content of the filler of the substrate. It was identified that, even if the percentage content of the filler in the substrate is 50% by volume, i.e., the percentage content of the filler is 45% or more.

Substrates having a percentage content of the filler of 76% by volume (a resin sheet in which an epoxy resin and a filler of silicon dioxide ($SiO_2$) are mixed) were prepared in response to the above-described evaluation results. Plasma processing was performed on the prepared substrates under three types of plasma condition: the plasma condition of 100 nm (1000 angstrom), the plasma condition of 250 nm (2500 angstrom), and the plasma condition of 500 nm (5000 angstrom). Accordingly, three types of evaluation examples of the wiring board 1 according to the embodiment were prepared.

Figure 12A:
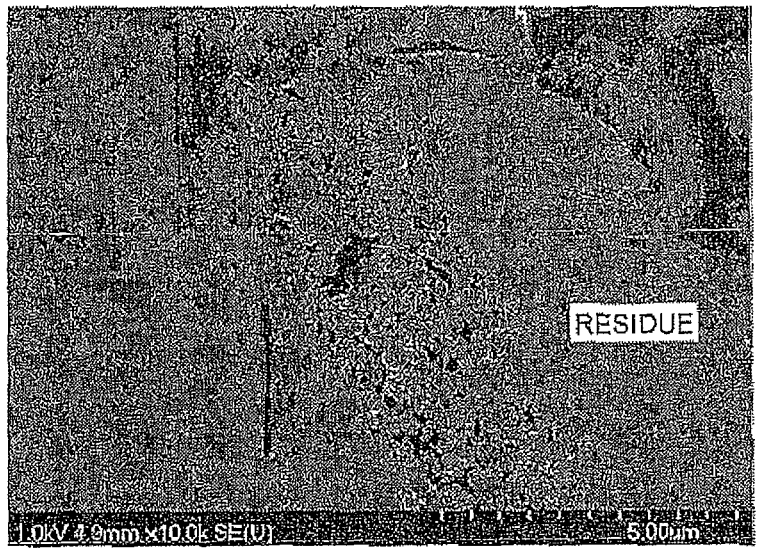
FIG. 12A shows a picture of an evaluation example illustrating a porous layer.
Figure 12B:
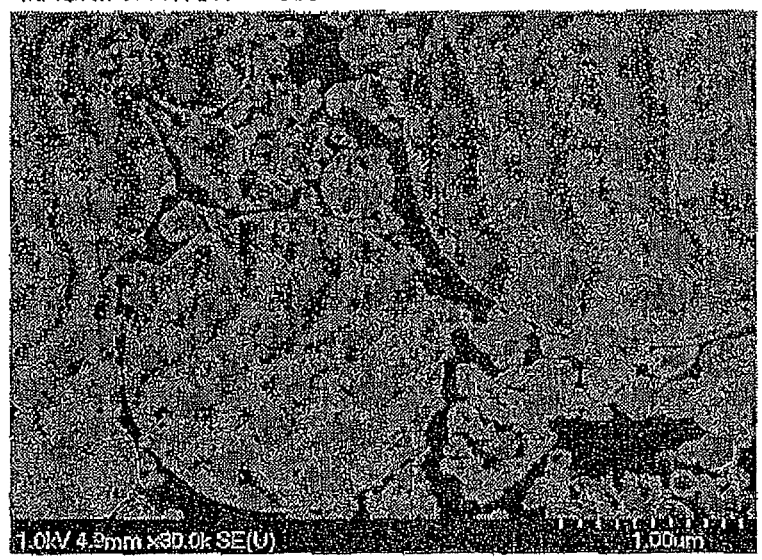
FIG. 12B shows a picture of an evaluation example illustrating a porous layer.

FIG. 12A and FIG. 12B show pictures of an evaluation example illustrating a porous layer. These pictures are SEM images of a porous layer that are captured by a scanning electron microscope (SEM). The magnification of FIG. 12A is 10000 and the magnification of FIG. 12B is 30000. As for the evaluation example of FIG. 12A and FIG. 12B, a plasma processing device performed ashing on the substrate of the evaluation example under the plasma condition of 500 nm and then performed a cross-sectioning process by using a focused ion beam (FIB). As shown in FIG. 12A, on the inner radial side with respect to the substrate and on the inner wall of the via formation hole, there is a mix area in which a filler space is provided between a plurality of fillers. As shown in FIG. 12B, when FIG. 12A is enlarged, it was identified that there is a filler space between fillers as shown in FIG. 12B. It can be thought that the fillers do not scatter but remain because the fillers are fixed to other fillers somewhere in the space on the circumference of the fillers.

Figure 13:
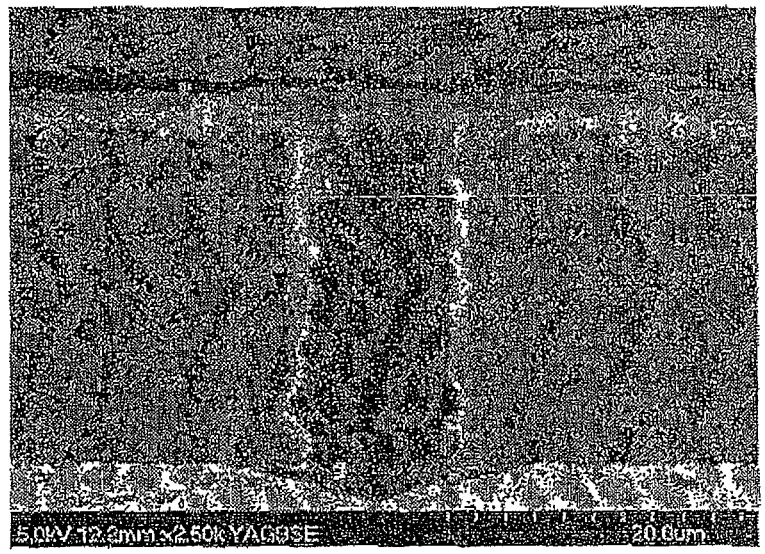
FIG. 13 shows a picture of an evaluation example, illustrating a mix layer.
Figure 14:
FIG. 14 shows a picture of an evaluation example, illustrating a mix layer.
Figure 15:
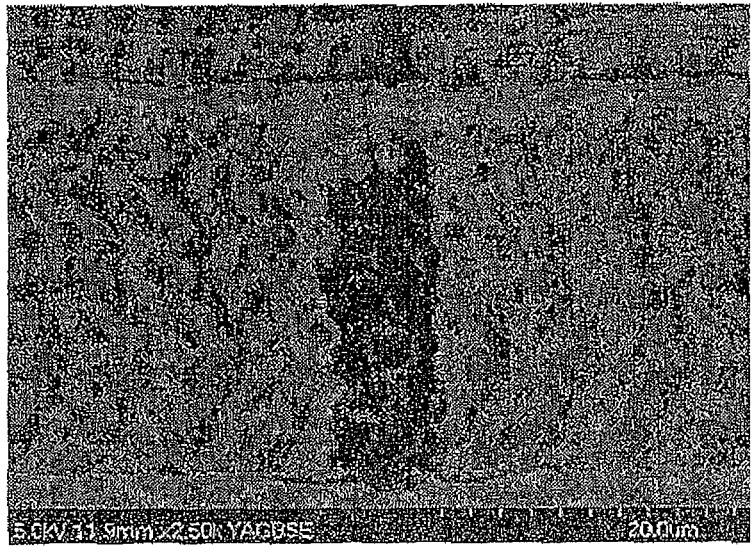
FIG. 15 shows a picture of an evaluation example, illustrating a mix layer.

FIGS. 13 to 15 show pictures of evaluation examples each illustrating a mix layer. The pictures shown in FIGS. 13 to 15 are each an SEM image of a mix layer captured by an SEM (magnification of 25000). The example of FIG. 13 was obtained by performing ashing on the substrate of the evaluation example under a plasma condition of 100 nm. The example of FIG. 14 was obtained by performing ashing on the substrate of the evaluation example under a plasma condition of 250 nm. The example of FIG. 15 was obtained by performing ashing on the substrate of the evaluation example under a plasma condition of 500 nm. FIGS. 13 to 15 are SEM images of examples captured by an SEM, which are examples obtained by performing copper (Cu) electroless plating on the porous layer to form a mix layer and then performing a cross-sectioning process by using a focused ion beam (FIB).

Each of the mix layers shown in each of FIG. 13, FIG. 14, and FIG. 15 is formed from one surface of the substrate to the other surface of the substrate in the thickness direction of the substrate. As for each of the mix layers shown FIG. 13, FIG. 14, and FIG. 15, the thickness of the adherence area of the mix layer becomes thinner from one surface of the substrate toward the other surface of the substrate in the thickness direction of the substrate. In other words, it is understood that, in each of the mix layers of FIG. 13, FIG. 14, and FIG. 15, the metal serving as the adherence area adhered by electroless plating is thin near the bottom of the via formation hole in which a via is formed.

Furthermore, in each of the mix layers of FIG. 13, FIG. 14, and FIG. 15, the mix area of the mix layer becomes thinner from one surface of the substrate (the opening side of the via formation hole) to the other surface of the substrate (the bottom side of the via formation hole) in the thickness direction of the substrate. It can be understood that, in each of the mix layers of FIG. 13, FIG. 14, and FIG. 15, even if the adherence area decreases near the bottom of the via formation hole, there is still a mix area. The mix area of the mix layer in FIG. 13 is thinner than the mix areas of the mix layers of FIG. 14 and FIG. 15. Accordingly, it is understood that, depending on the plasma condition, the thickness of the resin on which ashing is performed varies and the thickness of the mix area of the mix layer varies. Specifically, as the plasma reaction increases in strength, the thickness of the mix area of the mix layer increases.

The measured thickness of the mix area in FIG. 13 was between 0.5 μm and 0.8 μm. The measured thickness of the mix area in FIG. 14 was between 2 μm and 3 μm. The measured thickness of the mix area in FIG. 15 was between 4 μm and 5 μm.

As described above, as the aspect ratio increases, the thickness of the adherence area B shown in FIG. 2 decreases from the opening side of the via formation hole toward the bottom of the via formation hole. In the evaluation examples of FIG. 13, FIG. 14, and FIG. 15, the mix layer can be seen near the bottom of the via formation hole in which a via is formed, which allows electronic conduction between one surface of the substrate to the other surface of the substrate.

Figure 16A:
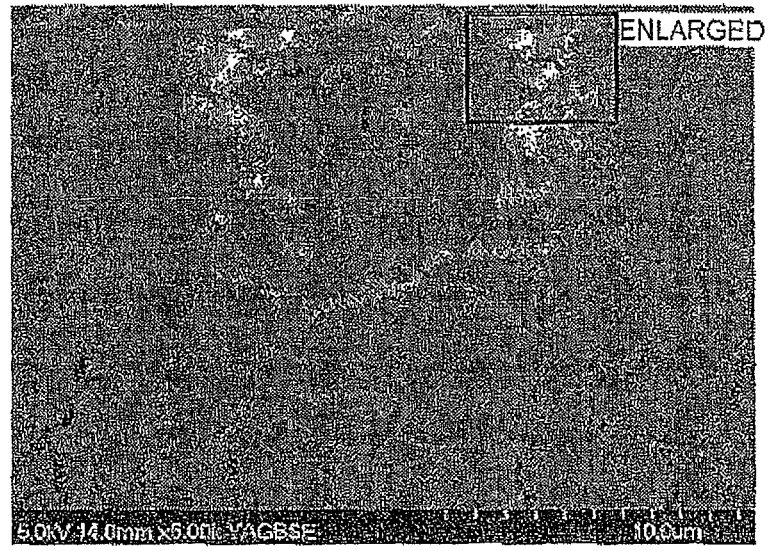
FIG. 16A shows a picture of an evaluation example illustrating a mix layer.

FIG. 16A shows a picture of an evaluation example illustrating a mix layer. The picture shown in FIG. 16A is an SEM image of a mix layer captured by an SEM. FIG. 16A is a cross-sectional SEM image of an example captured by an SEM, which is an example obtained by performing ashing on the substrate of the evaluation example under a plasma condition of 100 nm, repeating copper (Cu) electroless plating on the porous layer five times to form a mix layer, and then performing a cross-sectioning process by using a focused ion beam (FIB). The section obtained by using the FIB is a surface orthogonal to the imaging cross section of FIG. 13 and is in a plane that slices through via formation hole. In the evaluation example of FIG. 16A, because copper (Cu) electroless plating was repeated five times, the adherence area of the mix layer is thick.

Figure 16B:
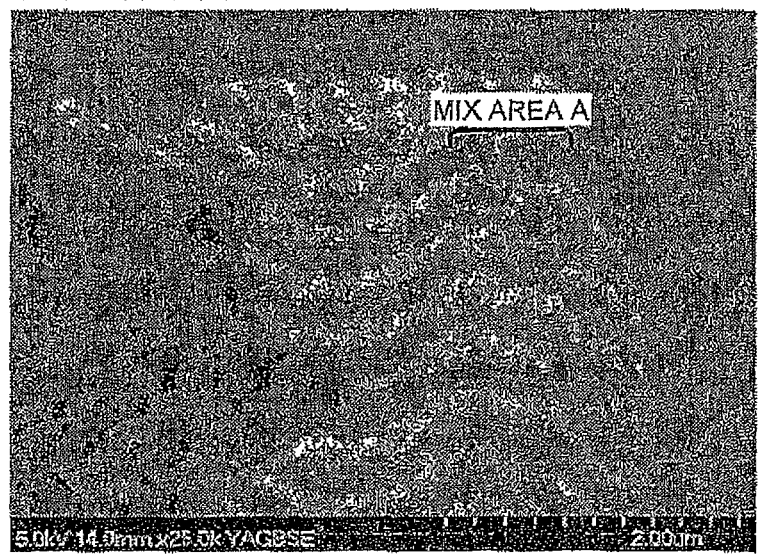
FIG. 16B shows an enlarged picture of the picture in FIG. 16A.

FIG. 16B shows an enlarged picture of the picture in FIG. 16A. The picture shown in FIG. 16B is an SEM picture of an enlarged-display area enlarged by a magnification of 25000. As shown in FIG. 16B, it can be understood that the mix area A contains a plurality of fillers and copper (Cu) serving as a conductive layer used for electroless plating between the fillers.

Figure 17:
FIG. 17 shows a picture of an evaluation example illustrating a filled via.

FIG. 17 shows a picture of an evaluation example illustrating a filled via. The plasma processing device performed ashing on the substrate of the evaluation example of FIG. 17 under the same condition as that of the mix layer shown in FIG. 13, i.e., a plasma condition of 100 nm, and performed copper (Cu) electroless plating on the porous layer. Further- more, the filled via of the sample of the evaluation example of FIG. 17 was prepared by using copper (Cu) electroplating. FIG. 17 is a cross-sectional SEM image of the sample captured by an SEM. The cross-sectioning process on the evaluation sample of FIG. 17 was performed by using an FIB. As shown in FIG. 17, when the filled via was formed by copper (Cu) electroless plating, no void or seam was found. Similarly, the filled via was evaluated for the samples for which the plasma processing device changes the plasma condition from 100 nm to 250 nm and 500 nm. No void and no seam were found. Next, the peel resistance that is the resistance of the mix layer to peeling was evaluated.

Figure 18:
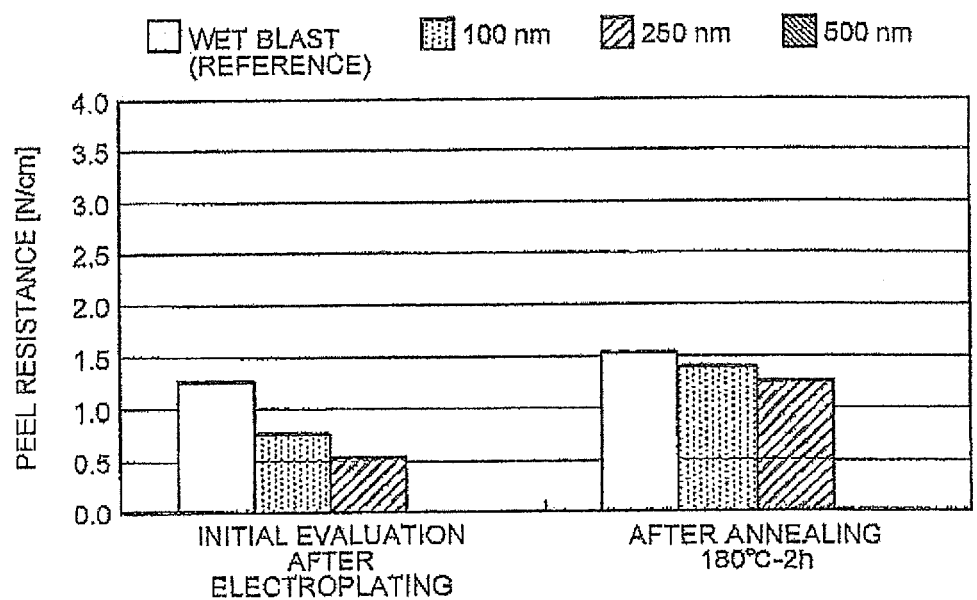
FIG. 18 is an illustrative diagram illustrating the relation between plasma condition and peel resistance.

FIG. 18 is an illustrative diagram illustrating the relation between plasma condition and peel resistance. As for the obtained samples of the evaluation examples whose peel resistance was evaluated, the plasma processing device performed ashing on the substrate of the evaluation examples under the same conditions as those of the mix layer, i.e., conditions of 100 nm, 250 nm, and 500 nm, and performed copper (Cu) electroless plating on the porous layer. The samples of the evaluation examples whose peel resistance was identified were prepared by using copper (Cu) electroplating on the filled via.

As a reference (comparative example) for identifying the peel resistance, a sample is prepared, without performing plasma processing by using a plasma processing device, by roughing the inner wall of the via formation hole by using a wet blast device. The wet blast device can roughen the inner wall of the via formation hole by spraying a slurry at a high pressure onto the inner wall of the via formation hole. The slurry is obtained by mixing particles of an abrasive agent, such as ceramics, with a solvent, such as water. The sample of the reference (comparative example) was prepared by performing copper (Cu) electroless plating on the inner wall of the via formation hole and then using copper (Cu) electroplating on the filled via.

As for the sample of the reference (comparative example) and the samples of the evaluation examples (samples prepared under plasma conditions of 100 nm, 250 nm, and 500 nm), the peel resistance was measured in an initial evaluation (after copper (Cu) electroplating) and after annealing (after two-hour thermal processing at 180° C.). A test conductive layer was formed by copper (Cu) electroplating on the inner wall of the via formation hole so as to have a test conductive layer with thickness of 12 μm. The peel resistance was measured by using a peel resistance test machine (push-pull gauge) by pulling up the test conductive layer of each sample in a direction orthogonal to the surface of the substrate (90 degrees) at a rate of 10 mm/sec. The results of the measurement are shown in the following Table 2 and in the graph in FIG. 18.

TABLE 2

| | | Peel resistance: (N/cm) | |
| --- | --- | --- | --- |
| | | Initial evaluation after electroplating | After annealing 180° C.-2 h |
| Wet blast (reference) | | 1.3 | 1.5 |
| CF$_4$ plasma processing | 100 nm | 0.8 | 1.4 |
| | 250 nm | 0.6 | 1.3 |
| | 500 nm | 0.0 | 0.0 |

As shown in Table 2 and FIG. 18, the samples of the evaluation examples had lower peel resistance than that of the reference (comparative example) at the initial evaluation.

However, after the annealing, the samples of the evaluation examples prepared under plasma conditions of 100 nm and 250 nm had the same level of peel resistance as that of the sample of the reference (comparative example).

In the sample of the evaluation example prepared under the plasma condition of 500 nm, there was a trend for peeling to occur easily. Accordingly, it is understood that, if the plasma processing apparatus increases the plasma condition and ashing is excessively performed on the substrate of the evaluation example, the porous layer becomes thick and there is a risk that the peeling resistance decreases. Accordingly, it is understood that it is necessary to adjust the plasma condition for ashing so as to achieve an appropriate thickness of the mix layer in accordance with the via diameter.

When the sample of the reference (comparative example) and the sample of the evaluation example were cut by an FIB and the cross sections were identified by using an SEM, a defect was found in the sample of the reference. It is thought that the reason for this is that a wet process was used, referred to as wet blast, and the slurry was not sufficiently removed. In the samples of the evaluation examples, there was no defect in the filled via. It is thought that the reason for this is that, in the samples of the evaluation examples, because the porous layer was prepared by using a dry process referred to as plasma processing, there was less foreign matter to be mixed compared to the wet process.

As described above, the wiring boards and the methods of manufacturing a wiring board according to the first embodiment, the second embodiment, the third embodiment, the fourth embodiment, and the modifications of these embodiments are preferably applied to a wiring board having a high aspect ratio larger than 1 because the size of the wiring board can be reduced. The wiring boards and the methods of manufacturing a wiring board are also preferably used for a wiring board with a small via diameter and fine interconnects. Furthermore, these wiring boards and these methods of manufacturing a wiring board can be applied to a wiring board having a via with an aspect ratio smaller than 1, which enhances the design freedom of the designer.

As described above, the wiring boards and the methods of manufacturing a wiring board according to the first embodiment, the second embodiment, the third embodiment, the fourth embodiment, and the modifications of the embodiments can be applied to a multi-layer wring board including multiple boards, which are layered, and to a method of manufacturing a multi-layer wiring board.

The wiring board, the electronic component embedded substrate, the method of manufacturing a wiring board, and the method of manufacturing an electronic component embedded substrate allow stable interlayer connection and thus a circuit board with a low risk of malfunction and high reliability can be made.

A wiring board according to an aspect of the present invention includes: a substrate that includes a resin containing a plurality of fillers; and a via that is electrically connected to at least one interconnect provided to the substrate, wherein the via includes a mix area in which metal is provided between the fillers on an inner radial side with respect to the substrate.

According to the wiring board, the mix area allows electrical interlayer connection and thus a low-resistance interconnect can be obtained. When a filled via is formed by electroplating, a mix area functions as an electron carrier during electroplating, which reduces defects of the filled via. Accordingly, stable interlayer connection is allowed and thus a circuit board with a low risk of malfunction and high reliability can be made.

Preferably, there is less resin contained in the mix area than the resin of the substrate. As a result, a filler space that is filled with metal can be formed between the fillers.

Preferably, the mix area allows electrical conduction. As a result, even if the via has a high aspect ratio and thus the adherence area is small near the bottom of the via formation hole, electrical interlayer connection is allowed and a low-resistance interconnect can be obtained.

Preferably, the mix area has a thickness of 3 µm or less. As a result, reliable peel resistance of the via with respect to the substrate can be obtained.

Preferably, the substrate, which includes the resin containing the fillers, is a laminated substrate in which a plurality of substrates each containing a plurality of fillers are superposed in a thickness direction and in which the percentage content of the fillers is different for each of the superposed substrates, and one of the superposed substrates having the higher percentage content of the fillers is arranged on the side of the bottom of a via formation hole in which a via is formed.

If the percentage content of the fillers is high, the mix area can be thick. As a result, by arranging the substrate in which the mix area is thick on the bottom of the via formation hole, a via having a high aspect ratio can be formed.

Preferably, a ratio of the depth of the via to the diameter of the via is larger than 1. This allows stable interlayer connection and achieves a wiring board with high reliability. Thus, a wiring board having a via with a small diameter and fine interconnects can be provided.

Preferably, the mix area has a percentage content of the fillers of between 45% and 76% by volume. An increase in the volume of the filler increases the thickness of the mix area. Accordingly, even if the via has a high aspect ratio and thus the adherence area is small near the bottom of the via formation hole, electrical interlayer connection is allowed and a low-resistance interconnect can be obtained.

Preferably, the substrate that includes the resin containing the fillers has a percentage content of the fillers of between 50% and 76% by volume. If the percentage content of the fillers is appropriate, the mix area can be formed stably.

A method of manufacturing a wiring board according to another aspect of the present invention includes: preparing a substrate that includes a resin containing a plurality of fillers; forming a via formation hole in the substrate; performing an ashing process on at least an inner wall of the via formation hole; and performing electroless plating on the inner wall of the via formation hole.

In the method, the resin containing the fillers is formed by plasma processing and the porous layer is impregnated with an electroless plating solution. As a result, the wiring board manufactured according to the method allows electrical interlayer connection and thus a low-resistance interconnect can be obtained. When a filled via is formed by electroplating, a mix area functions as an electron carrier during electroplating, which reduces defects of the filled via. Accordingly, stable interlayer connection is allowed and thus a circuit board with a low risk of malfunction and high reliability can be made.

Preferably, the method further includes filling the via formation hole with a conductive material by electroplating after the electroless plating is performed on the inner wall of the via formation hole. When a filled via is formed by electroplating, a mix area functions as an electron carrier during electroplating, which reduces defects of the filled via. Accordingly, stable interlayer connection is allowed and thus a circuit board with a low risk of malfunction and high reliability can be made.

Preferably, the method further includes filling the via formation hole with a conductive material by electroless plating after the electroless plating is performed on the inner wall of the via formation hole. In the method, the resin containing the fillers is formed by plasma processing and the porous layer is impregnated with an electroless plating solution. If electroless plating is continued, the conductive material is used for the filling by electroless plating so as to cover the metal with which the porous layer is impregnated, so that the porous layer and the conductive material are integrated. Accordingly, defects of the filled via can be reduced.

Preferably, the substrate has a percentage content of the fillers of between 50% and 76% by volume. An increase in the volume of the filler increases the thickness of the mix area. Accordingly, even if the via has a high aspect ratio and thus the adherence area is small near the bottom of the via formation hole, electrical interlayer connection is allowed and a low-resistance interconnect can be obtained.

Preferably, the substrate is obtained by superposing a first substrate that includes a resin containing a plurality of fillers and a second substrate that includes a resin containing a plurality of fillers in a larger percentage content than that of the first substrate. In the substrate having the larger percentage content of the fillers, the inner diameter of the via formation hole on the opening side can be increased. Accordingly, the inner diameter of the via formation hole on the opening side can be reduced toward the substrate having the lower percentage content of the fillers.

Preferably, an interconnect layer is arranged on one surface of the substrate, the second substrate is arranged, relative to the first substrate, on the side of the interconnect layer, and the via formation hole is formed so as to extend from the first substrate to the second substrate and reach the interconnect layer.

An increase in the percentage content of the fillers increases the thickness of the porous layer as a result of plasma processing. Thus, the area in which the porous layer is impregnated with an electroless plating solution increases, which allows more stable conduction. By arranging the substrate with the thick mix area on the bottom of the via formation hole, it is possible to form a via having a higher aspect ratio.

Preferably, a terminal electrode that is at least partly covered with an insulating material is arranged to be adjacent to one surface of the substrate, the second substrate is arranged, relative to the first substrate, on the side of the interconnect layer, and the via formation hole is formed so as to extend from the first substrate to the second substrate and reach the terminal electrode. An increase in the percentage content of the fillers increases the thickness of the porous layer as a result of plasma processing. Thus, the area in which the porous layer is impregnated with an electroless plating solution increases, which allows more stable conduction. By arranging the substrate with the thick mix area on the bottom of the via formation hole, it is possible to form a via having a higher aspect ratio. Thus, electrical interlayer connection with the terminal electrode is allowed and a lo-resistance interconnect can be obtained.

Preferably, a terminal electrode that is at least partly covered with an insulating material is arranged via the insulating material on one surface of the substrate, the second substrate is arranged, relative to the first substrate, on the side of the interconnect layer, and the via formation hole is formed so as to extend from the first substrate to the second substrate and reach the terminal electrode. An increase in the percentage content of the fillers increases the thickness of the porous layer as a result of plasma processing. Thus, the area in which the porous layer is impregnated with an electroless plating solution increases, which allows more stable conduction. By arranging the substrate with the thick mix area on the bottom of the via formation hole, it is possible to form a via having a higher aspect ratio. Furthermore, the via can be connected to the terminal electrode that is arranged via the insulating material. Thus, electrical interlayer connection with the terminal electrode is allowed and a lo-resistance interconnect can be obtained.

Preferably, a terminal electrode is arranged in the substrate and the via formation hole extends to the terminal electrode. Accordingly, even if the electronic component is embedded in the substrate, the electronic component and the wiring board can be connected with a low resistance to each other. As a result, the circuit board can be highly dense.

Preferably, an electronic component includes the terminal electrode. Accordingly, even if the electronic component is embedded in the substrate, the electronic component and the wiring board can be connected with a low resistance to each other. As a result, the circuit board can be highly dense.

An electronic component embedded substrate according to still another aspect of the present invention includes: a substrate that includes a resin containing a plurality of fillers; and a via that is electrically connected to at least one interconnect provided to the substrate, wherein the via includes a mix area in which metal is provided between the fillers on the inner radial side with respect to the substrate and the via is electrically connected to an electronic component embedded in the resin. Accordingly, even if the electronic component is embedded in the substrate, the electronic component and the wiring board can be connected with a low resistance to each other. As a result, the circuit board can be highly dense.

An electronic component embedded substrate according to still another aspect of the present invention includes: a resin layer that has a resin containing a plurality of fillers; an electronic component superposed on the resin layer; and a via that is provided to the resin layer, wherein the via includes a mix area in which metal is provided between the fillers on the inner radial side with respect to the substrate and the via is electrically connected to the electronic component. Accordingly, it is possible to prevent a chip due to chipping when a wafer is diced or a damage due to handling when the embedding in the substrate 10 is performed. Furthermore, even if the electronic component is embedded in the substrate, the electronic component and the wiring board can be connected with a low resistance to each other. As a result, the circuit board can be highly dense.

Preferably, the via is connected to the electronic component via a terminal electrode or a redistribution layer. Accordingly, stable connection is allowed and thus a circuit board with a low risk of malfunction and high reliability can be made.

A method of manufacturing an electronic component embedded substrate according to still another aspect of the present invention includes: superposing a resin layer that includes a resin containing a plurality of fillers on an electronic component; forming a via formation hole in the resin layer; performing an ashing process on at least an inner wall of the via formation hole; and performing electroless plating on the inner wall of the via formation hole. Accordingly, because the mix area can be formed near the electronic component to be connected, even if the via formation hole has a high aspect ratio, low-resistance connection with the via is allowed. Furthermore, it is possible to prevent a chip due to chipping when a wafer is diced or a damage due to handling when the embedding in the substrate 10 is performed. In addition, because the mix area can be formed near the electronic component to be connected, the resin in which the electronic component is embedded can be changed.

According to the present invention, a ceramic electronic component capable of suppressing peeling between laminated dielectric layers even though formed by laminating dielectric layers of different materials and a method of manufacturing such ceramic electronic components can be provided.

What is claimed is:

1. An electronic component embedded substrate comprising:
   a resin layer that has a resin containing a plurality of first fillers;
   an electronic component disposed under at least a portion of the resin layer; and
   a via that is provided to the resin layer,
   wherein the via includes a mix area which includes the resin and mental provided between a plurality of second fillers, and at least some of the second fillers are not connected to other ones of the second fillers through the resin on the inner radial side with respect to the substrate and the via is electrically connected to the electronic component.

2. The electronic component embedded substrate according to claim 1, wherein the via is connected to the electronic component via a terminal electrode or a redistribution layer.

* * * * *